(12) United States Patent
Motwani

(10) Patent No.: US 7,689,896 B2
(45) Date of Patent: Mar. 30, 2010

(54) MINIMAL HARDWARE IMPLEMENTATION OF NON-PARITY AND PARITY TRELLIS

(75) Inventor: Ravi Motwani, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 912 days.

(21) Appl. No.: 11/472,227

(22) Filed: Jun. 21, 2006

(65) Prior Publication Data

US 2007/0300138 A1 Dec. 27, 2007

(51) Int. Cl.
*H03M 13/03* (2006.01)
(52) U.S. Cl. .................. 714/792; 714/796; 714/755; 714/786
(58) Field of Classification Search .......... 714/755, 714/786, 792, 796
See application file for complete search history.

(56) References Cited

U.S. PATENT DOCUMENTS

| 3,542,756 | A | | 11/1970 | Gallager |
|---|---|---|---|---|
| 3,665,396 | A | | 5/1972 | Forney, Jr. |
| 4,295,218 | A | | 10/1981 | Tanner |
| 4,583,236 | A | * | 4/1986 | Kromer et al. ............... 375/286 |
| 5,406,570 | A | | 4/1995 | Berrou et al. |
| 5,446,747 | A | | 8/1995 | Berrou |
| 5,563,897 | A | | 10/1996 | Pyndiah et al. |
| 6,065,147 | A | | 5/2000 | Pyndiah et al. |
| 6,119,264 | A | | 9/2000 | Berrou et al. |
| 6,122,763 | A | | 9/2000 | Pyndiah et al. |
| 6,430,233 | B1 | | 8/2002 | Dillon et al. |
| 6,473,010 | B1 | | 10/2002 | Vityaev et al. |
| 6,567,465 | B2 | | 5/2003 | Goldstein et al. |
| 6,633,856 | B2 | | 10/2003 | Richardson et al. |
| 6,831,574 | B1 | * | 12/2004 | Mills et al. ..................... 341/50 |
| 7,519,898 | B2 | * | 4/2009 | Narayanan et al. .......... 714/801 |
| 2003/0104788 | A1 | | 6/2003 | Kim |
| 2007/0217522 | A1 | * | 9/2007 | Sun et al. ..................... 375/242 |
| 2008/0016433 | A1 | * | 1/2008 | Stolpman .................... 714/786 |

FOREIGN PATENT DOCUMENTS

EP  0 735 696 A2  10/1996

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—Guy J Lamarre
(74) *Attorney, Agent, or Firm*—Garlick Harrison & Markison; Shayne X. Short

(57) ABSTRACT

Minimal hardware implementation of non-parity and parity trellis. More than one type of trellis can be represented using a minimal amount of hardware. In magnetic recording systems and other communication systems types, there is oftentimes a need to switch between trellises which support parity and ones which do not. Rules are presented herein which will ensure joint representation of more than one trellis while requiring minimal additional hardware when compared to representing only one trellis. To represent the non-parity trellis, emanating states, resultant states, and one or more expansion states (if needed) are all that is required. Any expansion states may also need to have its path metric and path memory corresponded to one of the resultant states to ensure proper detection according to the non-parity trellis.

20 Claims, 22 Drawing Sheets

FOREIGN PATENT DOCUMENTS

| | | |
|---|---|---|
| EP | 0 735 696 A3 | 1/1999 |
| FR | 91 05278 A1 | 10/1992 |

OTHER PUBLICATIONS

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2. pp. 599-618, Feb. 2001.

* cited by examiner

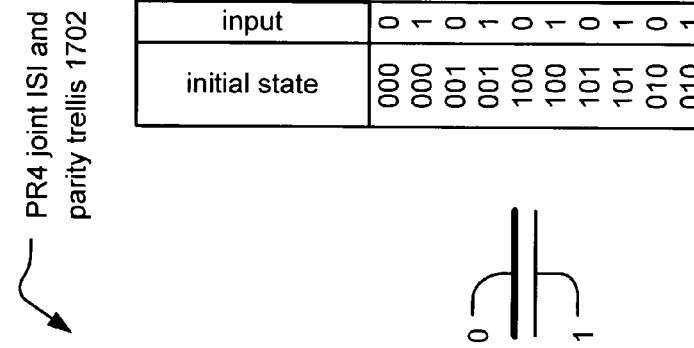
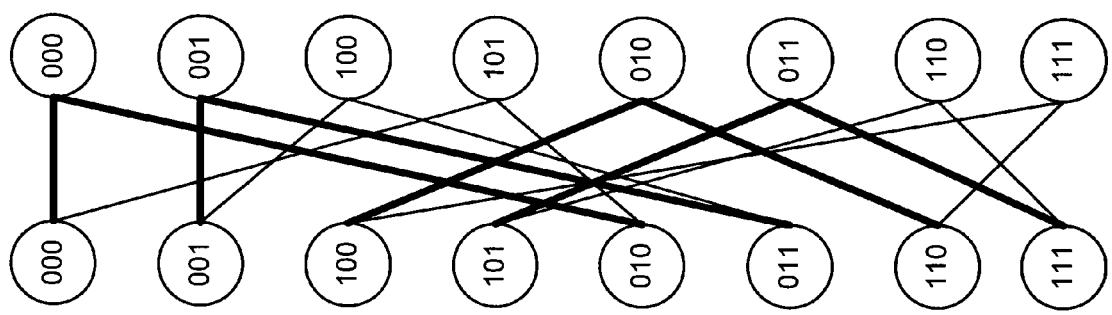
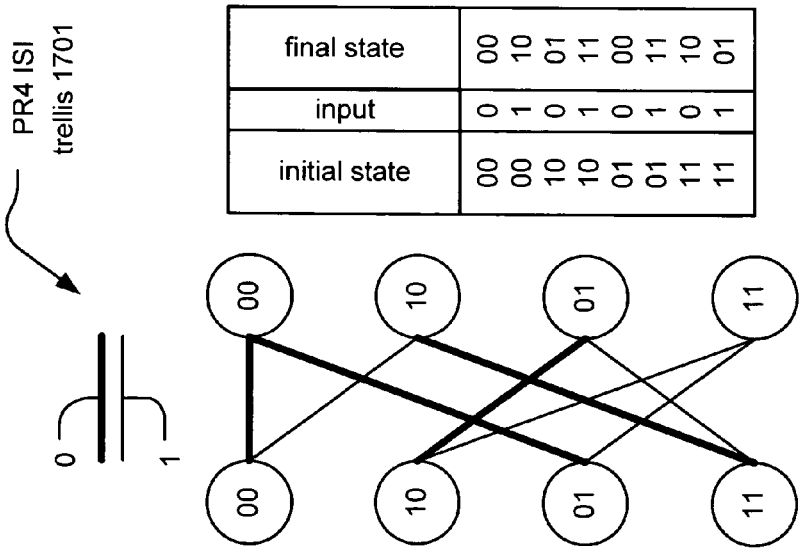
Fig. 17B
Fig. 17A

MINIMAL HARDWARE IMPLEMENTATION OF NON-PARITY AND PARITY TRELLIS

BACKGROUND OF THE INVENTION

1. Technical Field of the Invention

The invention relates generally to communication systems; and, more particularly, it relates to employing a trellis when performing iterative decoding processing of coded signals of such communication systems.

2. Description of Related Art

Data communication systems have been under continual development for many years. One such type of communication system that continues to be of significant interest is that which employs iterative error correction codes. Some examples of iterative correction codes include LDPC (Low Density Parity Check) codes and turbo codes. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Looking at error correcting LDPC codes, various types of LDPC codes have been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Within LDPC and other types of communication systems, a trellis is oftentimes employed to perform the detection of a coded signal that undergoes error corrective decoding. Moreover, sometimes the coded signal includes parity (e.g., one or more redundancy bits) as well and the trellis needs to be designed to accommodate this parity. In prior art systems, both the parity trellis and the non-parity trellis need to be implemented in hardware (which can be storing information corresponding to the trellis in memory) so that both the signal can employ the parity trellis at some times, and the non-parity trellis at other times when decoding the coded signal. Prior art approaches to representing these two trellises in hardware (e.g. in memory) are generally very inefficient, in that, the states and connectivity between each of the appropriate states is stored separately for both of the parity trellis and the non-parity trellis. In other words, in such a situation, there must be sufficient hardware (e.g. memory) provisioned to represent two totally distinct and separate trellises (i.e., the parity trellis and the non-parity trellis).

There exists a need in the art for a more efficient means by which more than one trellis can be represented in hardware (e.g. memory) for use in decoding different types of coded signals (e.g., those having parity and those not having parity).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 17A is a diagram illustrating an embodiment of a trellis employed for partial response 4 (PR4).

FIG. 17B is a diagram illustrating an embodiment of a PR4 joint ISI and parity trellis.

DETAILED DESCRIPTION OF THE INVENTION

A novel means is presented by which more than one type of trellis can be represented using a minimal amount of hardware. In magnetic recording systems and other communication systems types, there is oftentimes a need to switch between trellises which support parity and ones which do not. A very efficient means is provided with rules which will ensure joint representation of more than one trellis while requiring minimal additional hardware when compared to representing only one trellis.

Figure 1:
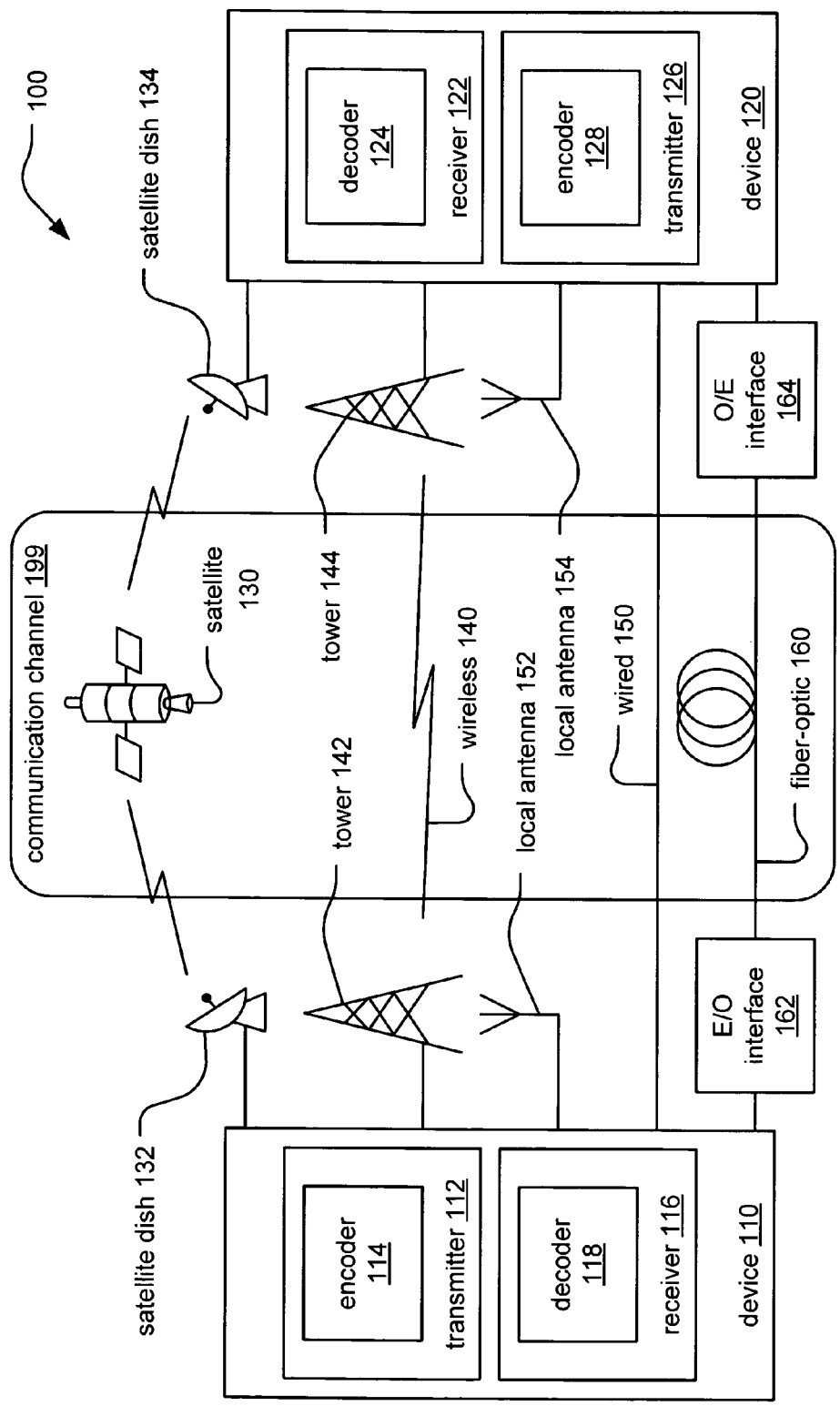
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
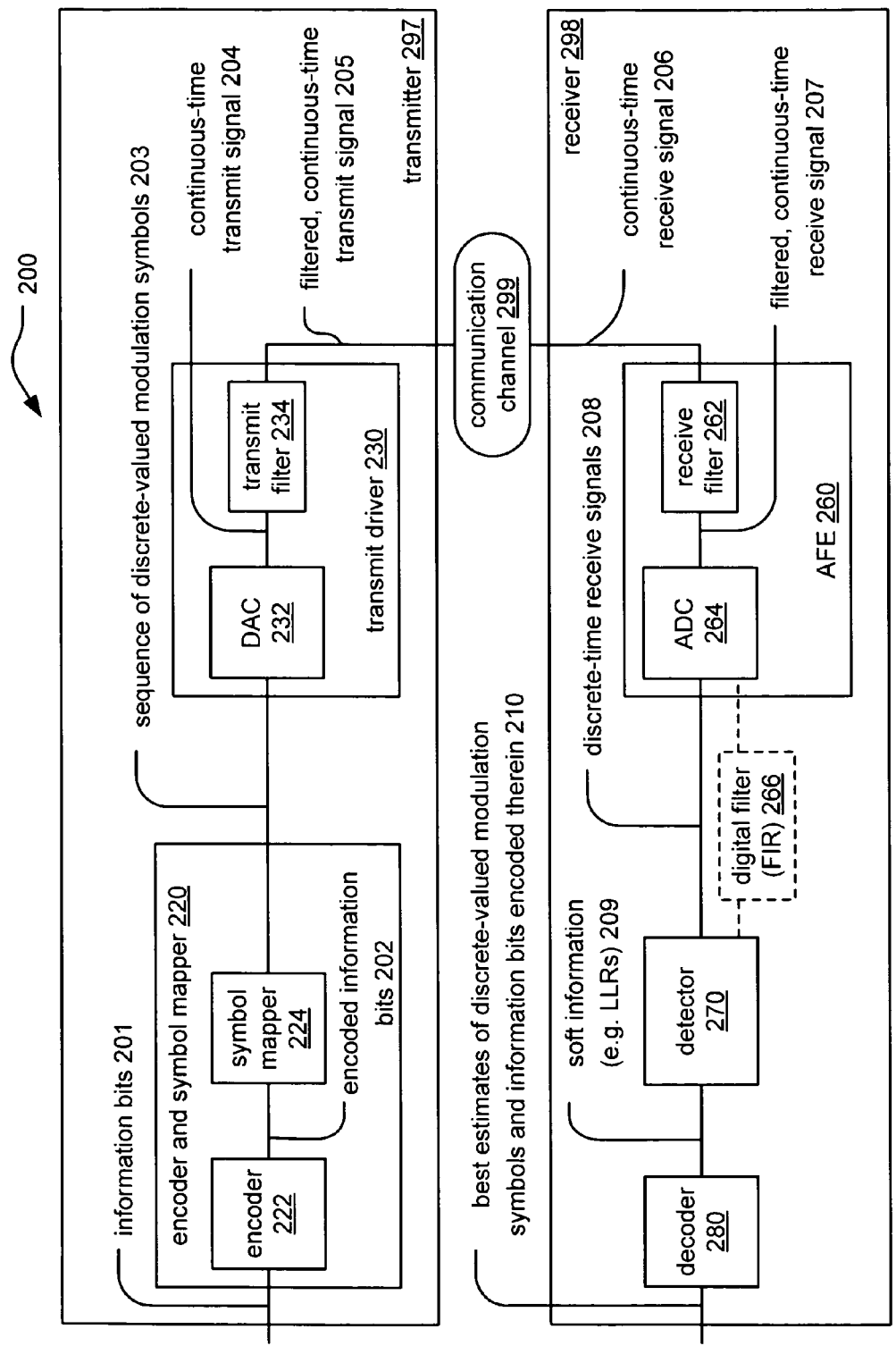

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (analog front-end) 260 that includes a receive filter 262 (that generates a filtered, continuous-time receive signal 207) and an ADC (analog to digital converter) 264 (that generates discrete-time receive signals 208). If desired, a digital filter (e.g., a finite impulse response (FIR) filter) 266 can be implemented to perform some digital filtering on the discrete-time receive signals 208.

A detector 270 calculates soft information (e.g., LLRs) 209 that are employed by a decoder 280 to make best estimates of the discrete-valued modulation symbols (or samples) and information bits encoded therein 210. The decoders of either of the previous embodiments may be implemented to include various aspects and/or embodiment of the invention therein. Generally speaking, the decoders are iterative error correction decoders that are operable to perform a plurality of decoding iterations therein.

In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
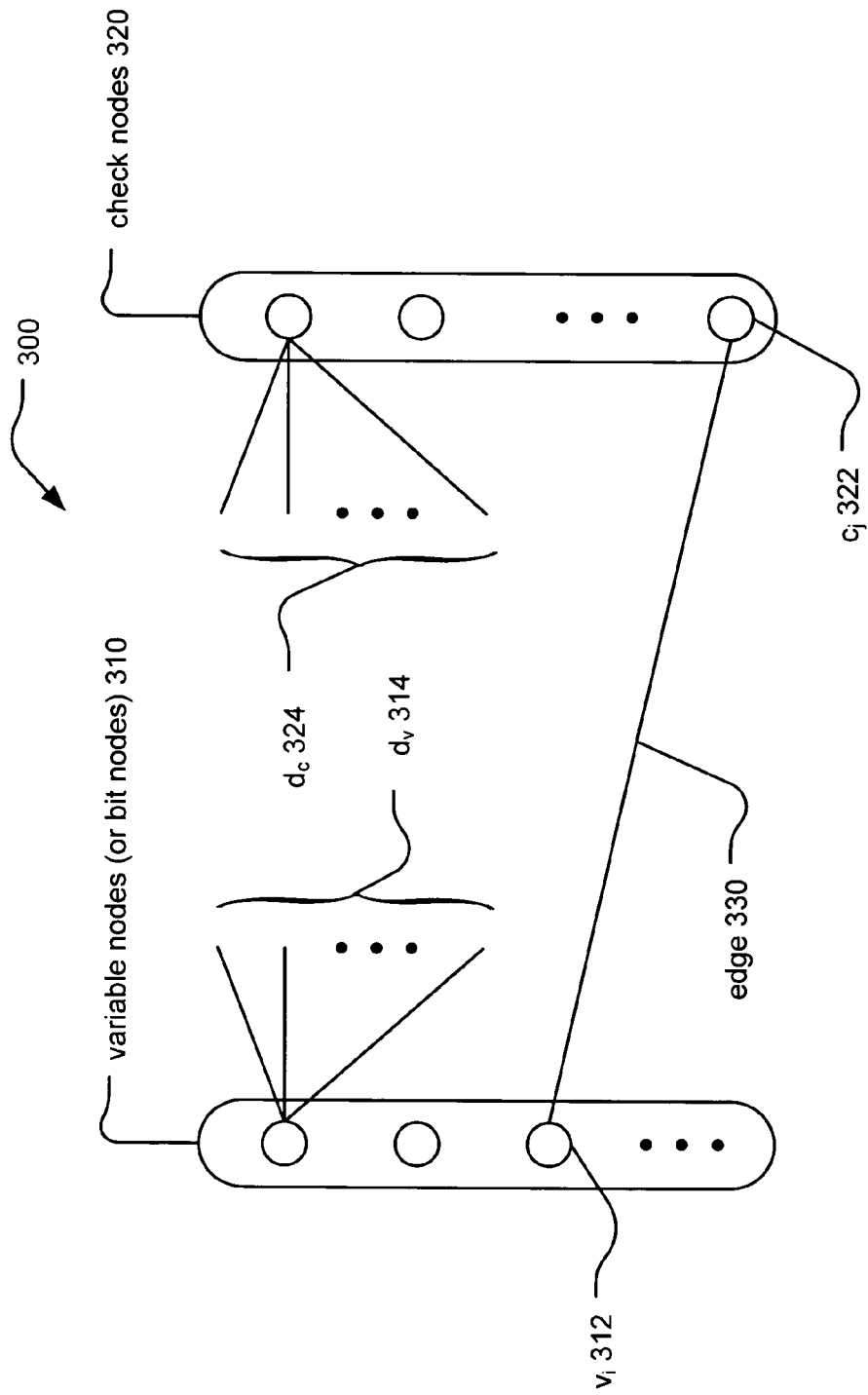
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC.

Figure 4:
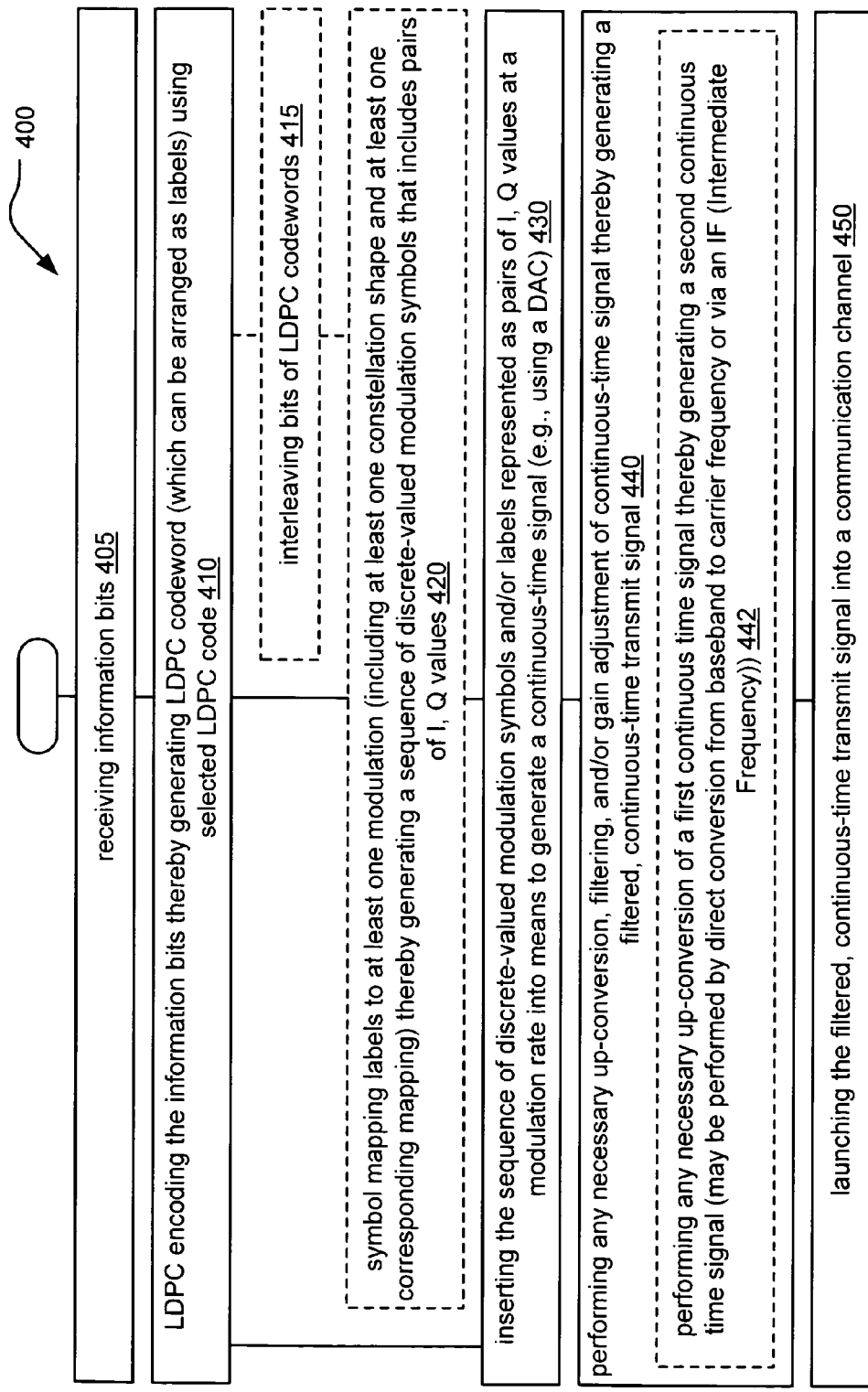
FIG. 4 illustrates an embodiment of a method for transmit processing of an LDPC coded signal.

FIG. 4 illustrates an embodiment of a method 400 for transmit processing of an LDPC coded signal. The method 400 that may be viewed as being performed at a transmitter end of a communication channel.

This method 400 also may be viewed as involving the generation of an LDPC coded signal as well as any operations to that are required to comport the LDPC coded signal to a communication channel into which a corresponding continuous-time transmit signal is to be launched.

Initially, this method 400 involves receiving information bits, as shown in a block 405. These information bits correspond to the actual information that is desired to be transmitted from one end of a communication channel to the other. At the other end, an effort to making best estimates of these original information bits is made. Continuing on, this method 400 involves LDPC encoding the information bits thereby generating an LDPC codeword (which can be arranged as labels), as shown in a block 410. For example, the LDPC codeword (or LDPC block) can be arranged to include labels that all have the same number of bits or labels of different bit sizes. This encoding may be performed using a selected LDPC code. In some instances, the method 400 may also involve interleaving the bits of a LDPC codeword after encoding them using an LDPC code, as shown in a block 415.

Then, as shown in a block 420, the method 400 then continues by symbol mapping the labels to at least one modulation (that includes at least one constellation shape and at least one corresponding mapping). In some embodiments, these labels are symbol mapped to a number of different modulation types thereby generating a variable modulation and/or code rate signal whose modulation and/or code rate may vary as frequently as on a frame by frame basis or even as frequently as on a symbol by symbol basis. This symbol mapping of the labels to at least one modulation thereby generates a sequence of discrete-valued modulation symbols that includes pairs of I, Q values (or higher dimensional constellation). At this point, the sequence of discrete-valued modulation symbols may be viewed as being an LDPC coded modulation signal (being in completely digital form at this point).

The method 400 then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method 400 may involve performing any necessary up-conversion, filtering, and/or gain adjustment of the continuous-time signal (e.g., the continuous-time baseband signal) thereby generating a filtered, continuous-time transmit signal, as shown in a block 440. This processing to generate the continuous-time signal may also involve performing any necessary up-conversion of a first continuous-time signal thereby generating a second continuous-time signal, or may involve direct conversion from baseband to carrier frequency or via an IF (Intermediate Frequency), as shown in a block 442.

There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method 500 that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). The diagram illustrated and described below shows the method 500 by which the receive processing of such a received continuous-time signal (e.g., at a receiver end of a communication channel) may be performed in an effort ultimately to make best estimates of the information bits that had been encoded therein.

Figure 5:
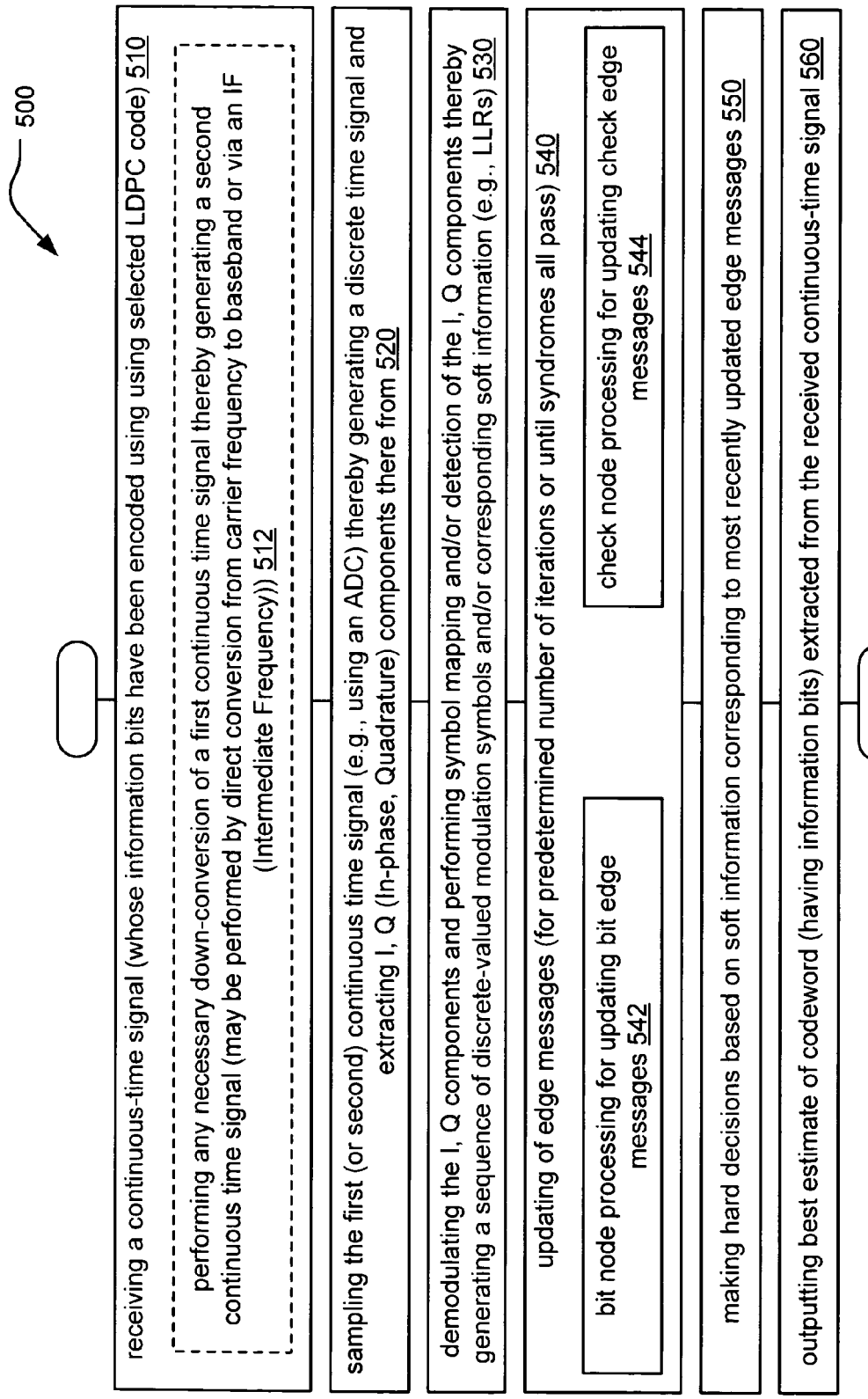
FIG. 5 illustrates an embodiment of a method for receive processing of an LDPC coded signal.

FIG. 5 illustrates an embodiment of a method 500 for receive processing of an LDPC coded signal. The method 500 initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method 500.

The method 500 also involves sampling the first (or second) continuous-time signal thereby generating a discrete time signal and extracting I, Q (In-phase, Quadrature) components there from, as shown in a block 520. This sampling may be performed using an ADC (analog to digital converter) or equivalent means to generate the discrete time signal from the appropriately down-converted (and potentially also filtered) received continuous-time signal. The I, Q components of the individual samples of the discrete time signal are also extracted within this step. The method 500 then involves demodulating the I, Q components and performing symbol mapping and/or detection of the I, Q components thereby generating a sequence of discrete-valued modulation symbols and/or corresponding soft information (e.g., LLRs (log likelihood ratios)), as shown in a block 530.

The next step of the method 500 of this embodiment involves performing updating of edge messages for a predetermined number of iterations (or until all syndromes of the LDPC code pass), as shown in a block 540. This step may be viewed as performing the LDPC decoding in accordance with any of the various embodiments described above. This LDPC decoding generally involves bit node processing for updating bit edge messages (as shown in a block 542) as well as check node processing for updating check edge messages (as shown in a block 544).

After the final decoding iteration of the predetermined number of decoding iterations (or until all syndromes of the LDPC code are equal to zero (i.e., all syndromes pass) in an alternative embodiment), the method 500 involves making hard decisions based on soft information corresponding to most recently updated edge messages with respect to the bit nodes, as shown in a block 550. The method 500 ultimately involves outputting a best estimate of the codeword (that includes the information bits) that has been extracted from the received continuous-time signal, as shown in a block 560.

Figure 6:
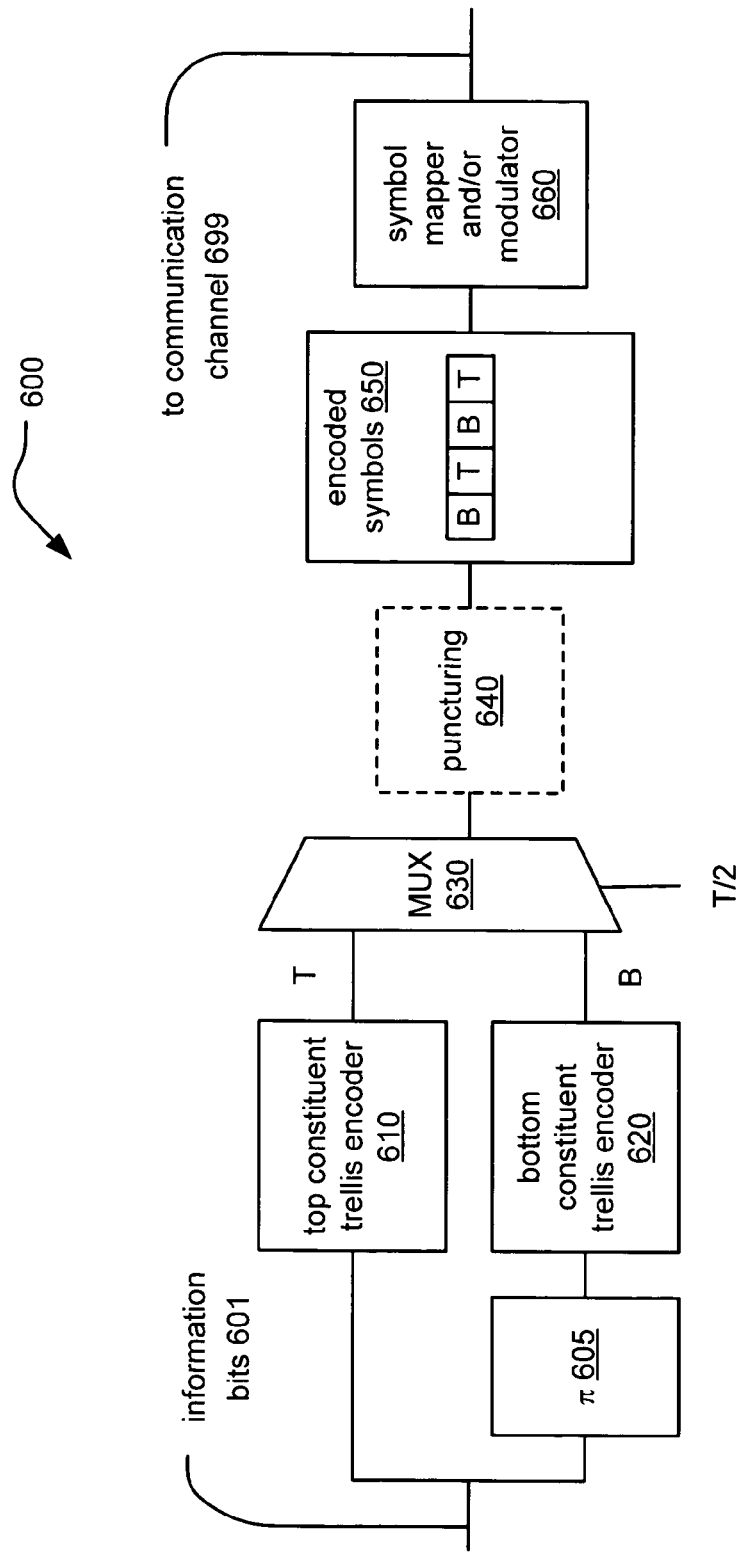
FIG. 6 illustrates an embodiment of a turbo encoder having a single interleaver.

FIG. 6 illustrates an embodiment of a turbo encoder having a single interleaver (shown as π 605). Information bits 601 are provided simultaneously to a top path and a bottom path. The top path includes a top constituent trellis encoder 610, and the bottom path includes a bottom interleaver (shown as π 605) communicatively coupled to a bottom constituent trellis encoder 620. A variety of interleaves may be performed as selected for the particular application within the bottom interleaver. Alternatively, embodiments may include two separate interleavers as well, such that the path leading to each of top path and the bottom path is interleaved to some degree.

The outputs from the top and bottom paths are provided to a multiplexor (MUX) 630 whose selection is provided by a clock signal that is clocked at ½ the rate at which the input bits are provided to the top and bottom paths. This way, the output of the MUX 630 will alternatively select the outputs from the top and bottom paths.

If desired in some embodiments, the bits output from the MUX 630 are then output to a puncturing module 640. In certain embodiments, no puncturing is performed on the bits output from the MUX 630; they are all simply passed as output from the puncturing module 640. A variety of encoded symbols 650 (which can alternatively be referred to as labels) may then be then generated according to the outputs from the top and bottom paths; the bottom path being an interleaved path. These encoded symbols 650 are then passed to the symbol mapper and/or modulator 660 according to the invention where the symbols are mapped according to the appropriate modulation (constellation and mapping) thereby forming a continuous time signal that comports with a communication channel (as shown by reference numeral 699). In a baseband implementation, a simply binary phase shift keying (BPSK) modulation format may be employed (e.g., where no higher order modulations are employed). The single interleaver embodiment of the turbo encoder 600 shows just one of the many embodiments in which error correction encoding may be performed.

It is noted that the interleaver (shown as π 605) within the FIG. 6 may be implemented such that it operates to correspond the order of the information bits 601 with the order in which the encoded symbols 650 are output and provided to the symbol mapper and/or modulator 660. That is to say, the first output, encoded symbol corresponds to the first group of information bits (or first input symbol); the second output, encoded symbol corresponds to the second group of information bits (or second input symbol). Alternatively, the interleaver (shown as π 605) may be implemented such that corresponding the order of the input bits (or symbols) need not necessarily correspond to the output order of the encoded symbols to the input order of the groups of input bits (or input symbols).

Figure 7:
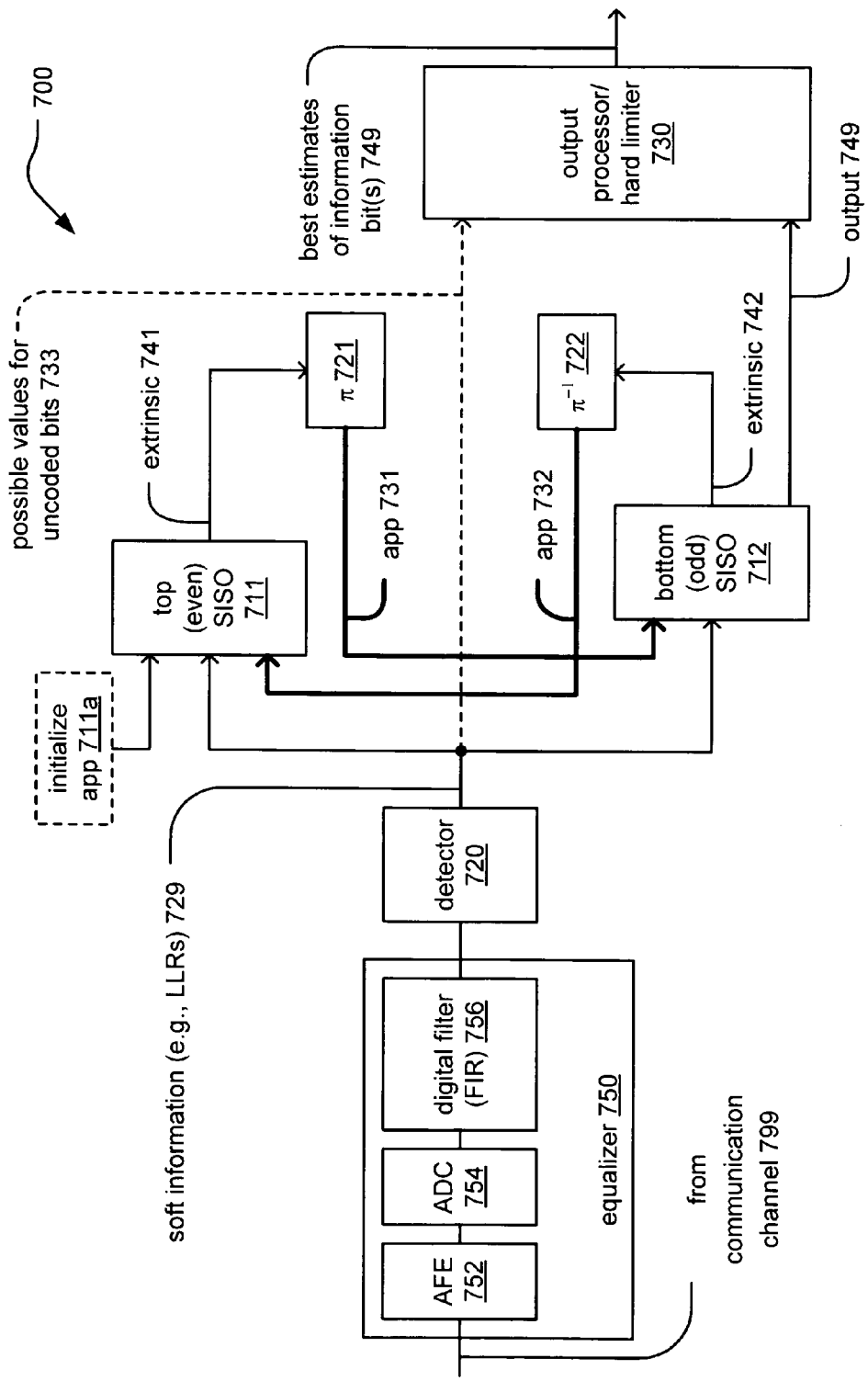
FIG. 7 illustrates an embodiment of a turbo decoder.

FIG. 7 illustrates an embodiment of a turbo decoder 700. A continuous time signal is received from a communication channel (as shown by reference numeral 799). This continuous time signal is provided to an equalizer 750 that includes an AFE (analog front-end) 752, an ADC (analog to digital converter) 754, and a digital filter (e.g., a finite impulse response (FIR) filter) 756. As required for a particular communication system implementation, the AFE 752 can perform any requisite analog filtering, frequency conversion, and/or gain control to get the signal into a format in which the ADC 754 can perform digital sampling. In some embodiments, no frequency conversion is required at all (e.g., baseband communication systems). The digital signal provided from the ADC 754 can then undergo digital filtering using the digital filter 756.

The sequence of samples and/or symbols (output from the equalizer 750) is then provided to a detector 720 that is operable to calculate soft information 729 there from for use in performing iterative error correction decoding. In some embodiments, this soft information 729 is implemented as LLRs (log likelihood ratios) that serve as the initial values employed within the iterative decoding processing.

Continuing on with the decoding process and functionality, the soft information 729 that is calculated by the detector 720 is then provided to a top (even) soft-in soft-out (SISO) 711 and simultaneously to a bottom (odd) SISO 712. Each of these SISOs 711 and 712 calculates forward metrics (alphas, or α) and backward metrics (betas, or β), and extrinsic values according to the particular trellis employed. The values employed as "a priori probability" or "app" can be initialized as shown by reference numeral 711a.

These alphas (α), betas (β), and extrinsics are all calculated for each sample or symbol within a frame of data that is to be decoded. These calculations of alphas (α), betas (β), and extrinsics are all based on the trellis that is employed to perform the demodulation of the sample and/or symbols from the continuous time signal that is received from the communication channel.

Starting with the top SISO 711, after the extrinsic values 741 have been calculated, they are passed to an interleaver (shown as $\pi$ 721) after which it is passed to the bottom SISO 712 as "a priori probability" (app) information 731. Similarly, after extrinsic values 742 have been calculated within the bottom SISO 712, they are passed to a de-interleaver (shown as $\pi^{-1}$ 722) after which it is passed to the top SISO 711 as "a priori probability" (app) information. It is noted that a single decoding iteration, within the iterative decoding process of the turbo decoder 700 consists of performing two SISO operations; that is to say, the iterative decoding process must pass through both the top (even) SISO 711 and through the bottom (odd) SISO 712.

After a significant level of confidence has been achieved and a solution is being converged upon, or after a predetermined number of decoding iterations have been performed, then the output from the bottom (odd) SISO 712 is passed as the output 749 to an output processor 730 that is operable to provide best estimates of the information bit(s) 749. The operation of the SISOs 711 and 712 may generally be referred to as calculating soft symbol decisions of the symbols and/or samples contained within the received frame of data.

Figure 8:
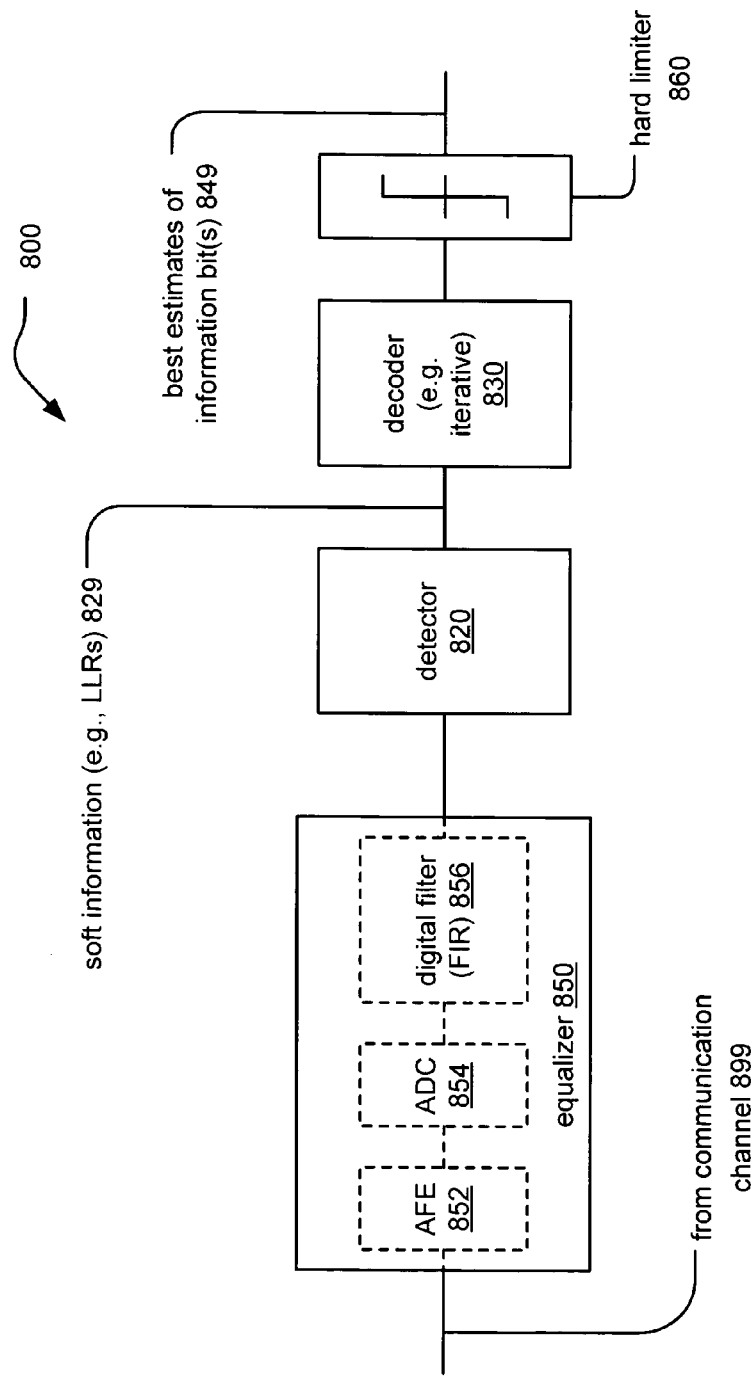
FIG. 8 illustrates an embodiment of an apparatus including a detector and an iterative decoder.

FIG. 8 illustrates an embodiment of an apparatus 800 including a detector 820 and an iterative decoder 830. Somewhat analogous to other embodiments described herein, a continuous time signal is received from a communication channel (as shown by reference numeral 899). This continuous time signal is provided to an equalizer 850. This equalizer 850 can be implemented in a variety of ways. One embodiment of the equalizer 850 includes an AFE (analog front-end) 852, an ADC (analog to digital converter) 854, and a digital filter (e.g., a finite impulse response (FIR) filter) 856. As required for a particular communication system implementation, the AFE 852 can perform any requisite analog filtering, frequency conversion, and/or gain control to get the signal into a format in which the ADC 854 can perform digital sampling. In some embodiments, no frequency conversion is required at all (e.g., baseband communication systems). The digital signal provided from the ADC 854 can then undergo digital filtering using the digital filter 856.

The output of the equalizer 850 is then a sequence of samples and/or symbols that is then provided to a detector 820 that is operable to calculate soft information 829 there from for use in performing iterative error correction decoding. In some embodiments, this soft information 829 is implemented as LLRs (log likelihood ratios) that serve as the initial values employed within the iterative decoding processing by a decoder 830 (that is iterative in nature).

This apparatus 800 generally depicts the decoder 830 therein that is operable to perform one or more local decoding iterations. The decoder 830 can be implemented as an LDPC decoder, a turbo decoder, a turbo trellis coded modulation (TTCM) decoder, or any type of iterative decoder that employs soft information (e.g., the soft information 829, which can be provided in the form of LLRs, if desired).

After all of the performed decoding iterations are performed, then the output from the decoder 830 and provided to a hard limiter 860 that is operable to make hard decisions of the soft symbol estimates (or soft sample estimates) provided thereto. The output from the hard limiter 860 is the best estimates of the information bit(s) 849 (e.g., those information bits being those that have been encoded using an encoder type that corresponds to the type of decoder 830, such as an LDPC encoder, turbo encoder, TTCM encoder, etc.).

This diagram shows generally how a detector can be implemented in conjunction with any iterative type decoder that employs soft information within its decoding processing. It is noted that various methods and/or apparatus embodiments can be implemented to perform LDPC decoding, turbo decoding, or some other type of iterative decoding functionality to employ the soft information calculated using detector functionality as depicted herein. Additional details of the calculation of such soft information are provided below as well. Certain aspects of such soft information calculation can be performed within a wide variety of communication systems, including those embodiments described above.

Another apparatus or system employing error correction codes can be one that includes hard disk drives (HDDs). Within such hard disk drives (HDDs), error correction coding (ECC) is sometimes employed to ensure the ability to correct for errors of data that is written to and read from the storage media of a HDD. The ECC allows the ability to correct for those errors within the error correction capability of the code. Some embodiments and details of such HDD embodiments are provided below.

Figure 9:
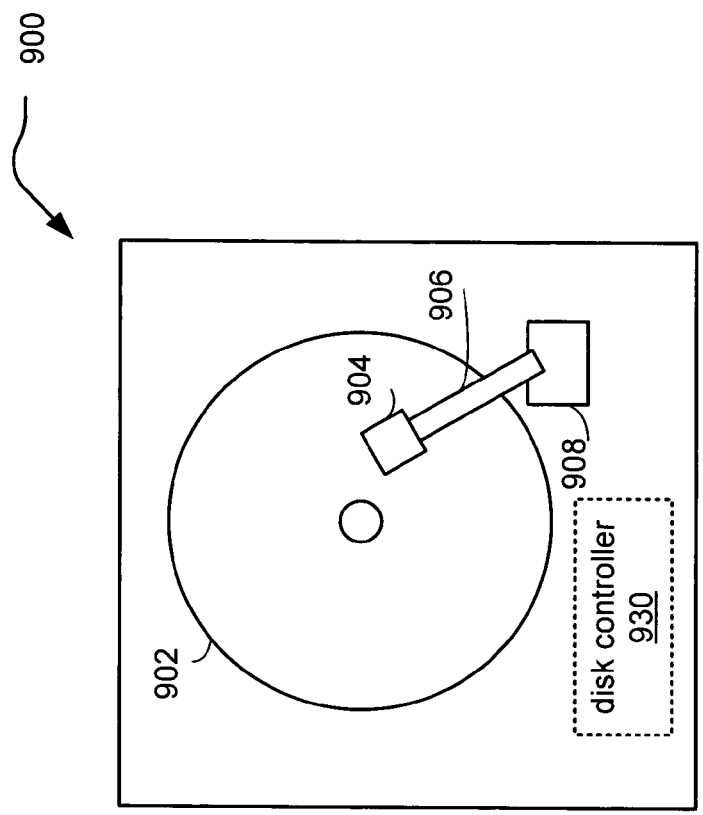
FIG. 9 illustrates an embodiment of a disk drive unit.

FIG. 9 illustrates an embodiment of a disk drive unit 900. In particular, disk drive unit 900 includes a disk 902 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 902 can be a magnetic disk that stores information as magnetic field changes on some type of magnetic medium. The medium can be a rigid or non-rigid, removable or non-removable, that consists of or is coated with magnetic material.

Disk drive unit 900 further includes one or more read/write heads 904 that are coupled to arm 906 that is moved by actuator 908 over the surface of the disk 902 either by translation, rotation or both. A disk controller 930 is included for controlling the read and write operations to and from the drive, for controlling the speed of the servo motor and the motion of actuator 908, and for providing an interface to and from the host device.

Figure 10:
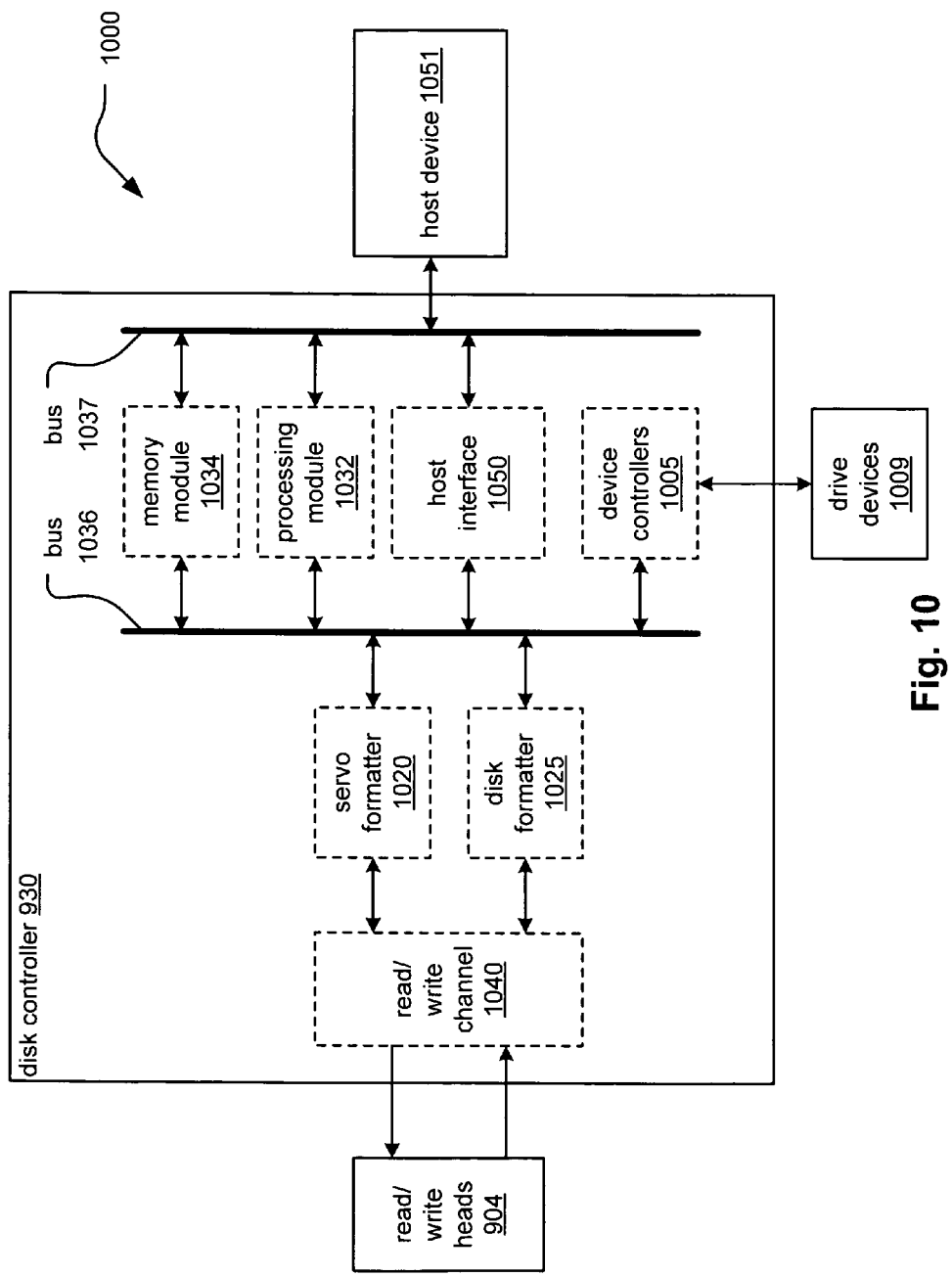
FIG. 10 illustrates an embodiment of a disk drive unit including a disk controller.

FIG. 10 illustrates an embodiment of an apparatus 1000 that includes a disk controller 930. In particular, disk controller 930 includes a read/write channel 1040 for reading and writing data to and from disk 902 through read/write heads 904. Disk formatter 1025 is included for controlling the formatting of data and provides clock signals and other timing signals that control the flow of the data written to, and data read from disk 902. Servo formatter 1020 provides clock signals and other timing signals based on servo control data read from disk 902. Device controllers 1005 control the operation of drive devices 1009 such as actuator 908 and the servo motor, etc. Host interface 1050 receives read and write commands from host device 1051 and transmits data read from disk 902 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 930 further includes a processing module 1032 and memory module 1034. Processing module 1032 can be implemented using one or more microprocessors, microcontrollers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 1034. When processing module 1032 is implemented with two or more devices, each device can perform the same steps, processes or functions in order to provide fault tolerance or redundancy. Alternatively, the function, steps and processes performed by processing module 1032 can be split between different devices to provide greater computational speed and/or efficiency.

Memory module 1034 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 1032 implements one or more of its functions via a state machine, analog circuitry, digital circuitry, and/or logic circuitry, the memory module 1034 storing the corresponding operational instructions may be embedded within, or external to, the circuitry comprising the state machine, analog circuitry, digital circuitry, and/or logic circuitry. Further note that, the memory module 1034 stores, and the processing module 1032 executes, operational instructions that can correspond to one or more of the steps or a process, method and/or function illustrated herein.

Disk controller 930 includes a plurality of modules, in particular, device controllers 1005, processing module 1032, memory module 1034, read/write channel 1040, disk formatter 1025, servo formatter 1020 and host interface 1050 that are interconnected via bus 1036 and bus 1037. Each of these modules can be implemented in hardware, firmware, software or a combination thereof, in accordance with the broad scope of the present invention. While a particular bus architecture is shown in FIG. 10 with buses 1036 and 1037, alternative bus architectures that include either a single bus configuration or additional data buses, further connectivity, such as direct connectivity between the various modules, are likewise possible to implement the features and functions included in various embodiments.

In one possible embodiment, one or more modules of disk controller 930 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 1005 and optionally additional modules, such as a power supply, etc. In a further embodiment, the various functions and features of disk controller 930 are implemented in a plurality of integrated circuit devices that communicate and combine to perform the functionality of disk controller 930.

When the apparatus 1000 (which can be viewed as being a "drive unit") is manufactured, disk formatter 1025 writes a plurality of servo wedges along with a corresponding plurality of servo address marks at equal radial distance along the disk 902. The servo address marks are used by the timing generator for triggering the "start time" for various events employed when accessing the media of the disk 902 through read/write heads 904.

Figure 11:
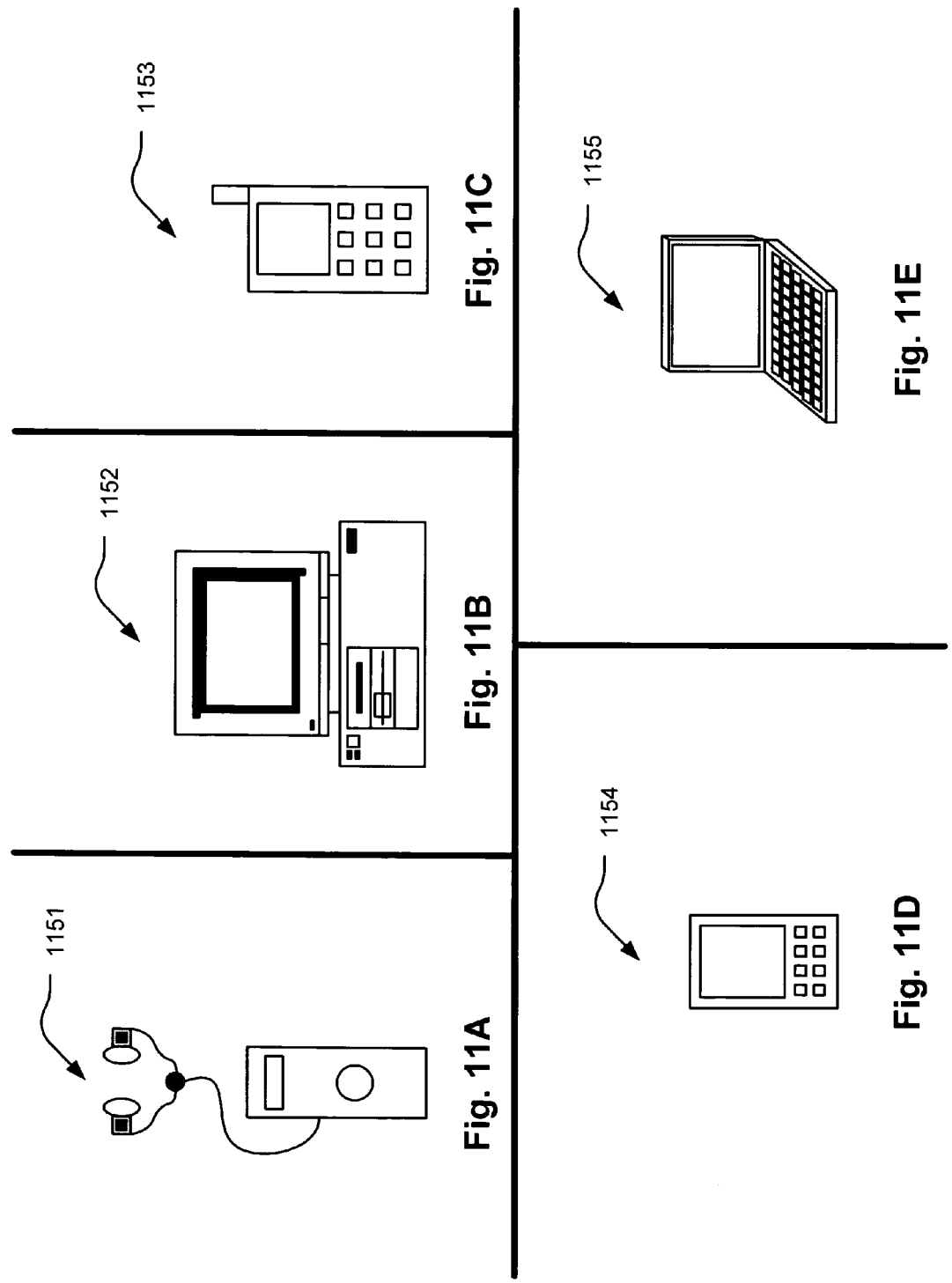
FIG. 11A illustrates an embodiment of a handheld audio unit.
FIG. 11B illustrates an embodiment of a computer.
FIG. 11C illustrates an embodiment of a wireless communication device.
FIG. 11D illustrates an embodiment of a personal digital assistant (PDA).
FIG. 11E illustrates an embodiment of a laptop computer.

FIG. 11A illustrates an embodiment of a handheld audio unit 1151. In particular, disk drive unit 900 can be implemented in the handheld audio unit 1151. In one possible embodiment, the disk drive unit 900 can include a small form factor magnetic hard disk whose disk 902 has a diameter 1.8" or smaller that is incorporated into or otherwise used by handheld audio unit 1151 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 11B illustrates an embodiment of a computer 1152. In particular, disk drive unit 900 can be implemented in the computer 1152. In one possible embodiment, disk drive unit 900 can include a small form factor magnetic hard disk whose disk 902 has a diameter 1.8" or smaller, a 2.5" or 3.5" drive or larger drive for applications such as enterprise storage applications. Disk drive unit 900 is incorporated into or otherwise used by computer 1152 to provide general purpose storage for any type of information in digital format. Computer 1152 can be a desktop computer, or an enterprise storage devices such a server, of a host computer that is attached to a storage array such as a redundant array of independent disks (RAID) array, storage router, edge router, storage switch and/or storage director.

FIG. 11C illustrates an embodiment of a wireless communication device 1153. In particular, disk drive unit 900 can be implemented in the wireless communication device 1153. In one possible embodiment, disk drive unit 900 can include a small form factor magnetic hard disk whose disk 902 has a diameter 1.8" or smaller that is incorporated into or otherwise used by wireless communication device 1153 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 1153, emails, webpage information and other information downloaded from the Internet, address book information, and/or any other type of information that may be stored in a digital format.

In a possible embodiment, wireless communication device 1153 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 1153 is capable of communicating via the Internet to access email, download content, access websites, and provide steaming audio and/or video programming. In this fashion, wireless communication device 1153 can place and receive telephone calls, text messages such as emails, short message service (SMS) messages, pages and other data messages that can include attachments such as documents, audio files, video files, images and other graphics.

FIG. 11D illustrates an embodiment of a personal digital assistant (PDA) 1154. In particular, disk drive unit 900 can be implemented in the personal digital assistant (PDA) 1154. In one possible embodiment, disk drive unit 900 can include a small form factor magnetic hard disk whose disk 902 has a diameter 1.8" or smaller that is incorporated into or otherwise used by personal digital assistant 1154 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 11E illustrates an embodiment of a laptop computer 1155. In particular, disk drive unit 900 can be implemented in the laptop computer 1155. In one possible embodiment, disk drive unit 900 can include a small form factor magnetic hard disk whose disk 902 has a diameter 1.8" or smaller, or a 2.5" drive. Disk drive 100 is incorporated into or otherwise used by laptop computer 1152 to provide general purpose storage for any type of information in digital format.

Figure 12:
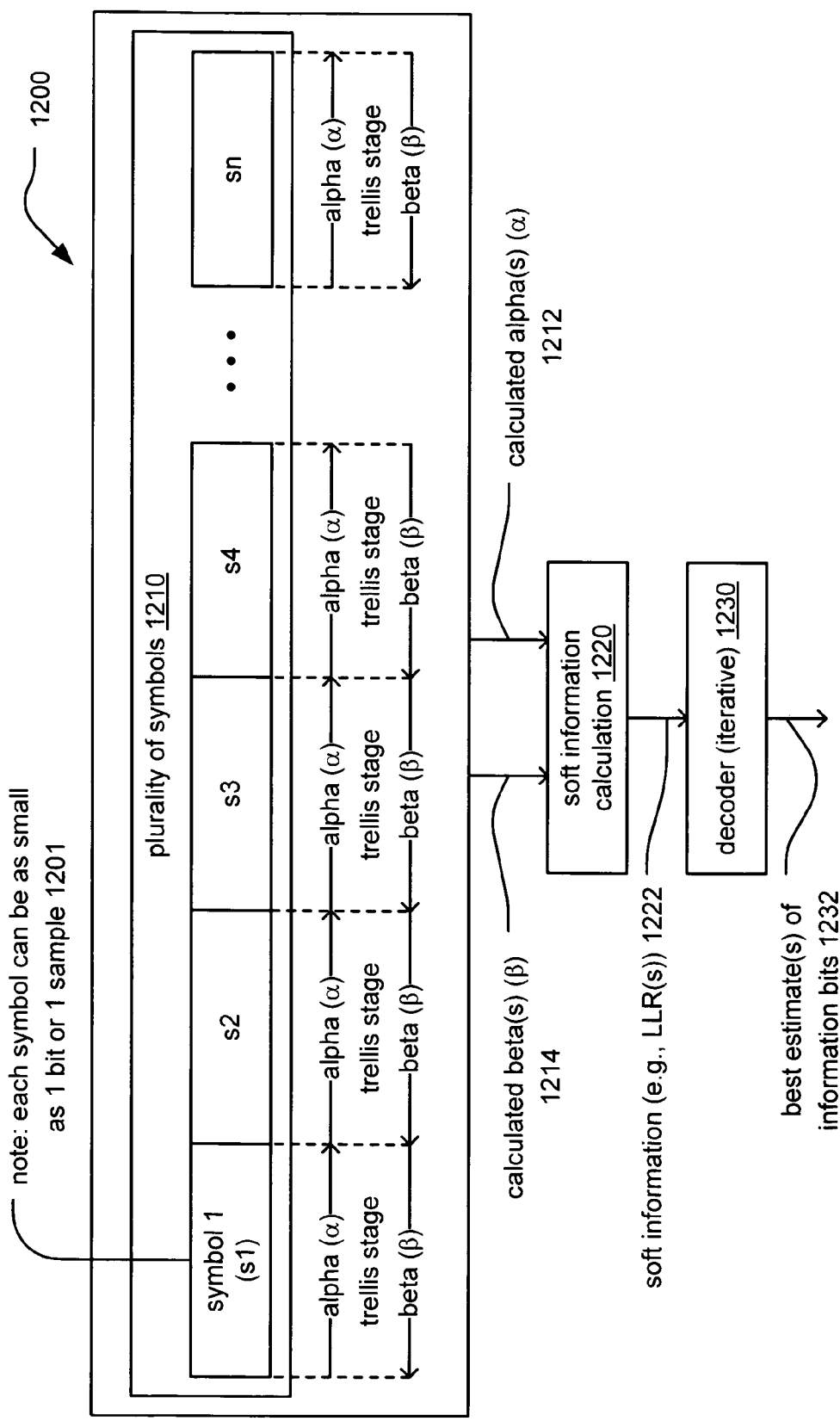
FIG. 12 illustrates an embodiment that performs soft information calculation.

FIG. 12 illustrates an embodiment 1200 that performs soft information calculation. A plurality of symbols 1210 is received. As depicted using the reference numeral 1201, it is noted that each symbol within the plurality of symbols 1210 can be as small as 1 bit or 1 sample. Generally speaking, the term "symbol" is employed, yet the reader is reminded to keep in mind that a symbol can include as few as 1 bit or 1 sample. For example, in a baseband communication system that employs a binary phase shift keying (BPSK) modulation format, then each symbol is only 1 bit. Also, when using such a BPSK modulation format, each sample could also correspond to that 1 bit as well.

At the very beginning of the receipt of the plurality of symbols 1210, the forward metrics (α) can begin to be calculated. Once all of the plurality of symbols 1210 have been received (e.g., once a frame of data has been received), then the backward metrics (β) can begin to be calculated.

It is noted that each symbol within the plurality of symbols (i.e., as depicted using s1, s2, . . . , sn) has corresponding forward metrics (α) and backward metrics (β) as defined according to each trellis stage. The trellis is employed to perform the demodulation of the sample and/or symbols from a continuous time signal that is received from the communication channel. Generally speaking, in a communication system that incurs inter-symbol interference (ISI), a trellis can be employed to perform the demodulation of the symbols within the continuous time signal that is received from the communication system. The trellis can be viewed as being replicated to form a lattice structure, such that one trellis stage corresponds to each symbol within the plurality of symbols 1210. The lattice structure then spans the entirety of the plurality of symbols 1210, such that one trellis stage corresponds to each symbol of the plurality of symbols 1210.

The forward metrics (α) and the backward metrics (β) are then calculated. The calculated forward metrics or alpha(s) (α) 1212 and the calculated backward metrics beta(s) (β) 1214 are then provided to a soft information calculation module 1220. The soft information calculation module 1220 then uses these calculated forward metrics or alpha(s) (α) 1212 and the calculated backward metrics beta(s) (β) 1214 to calculate soft information 1222 for each symbol of the plurality of symbols 1210. If desired, this soft information 1222 can be calculated as LLRs (log likelihood ratios). The soft information 1222 is provided to a decoder 1230 (that is iterative in nature) which then uses the soft information 1222 to makes best estimates of the information bits of each symbol of the plurality of symbols 1210.

For this embodiment as well as any embodiment that employs a trellis, it is noted that the final state after one trellis stage transition operates as the initial state for the next trellis stage transition, and so on through the packet of symbols being decoded.

Figure 13:
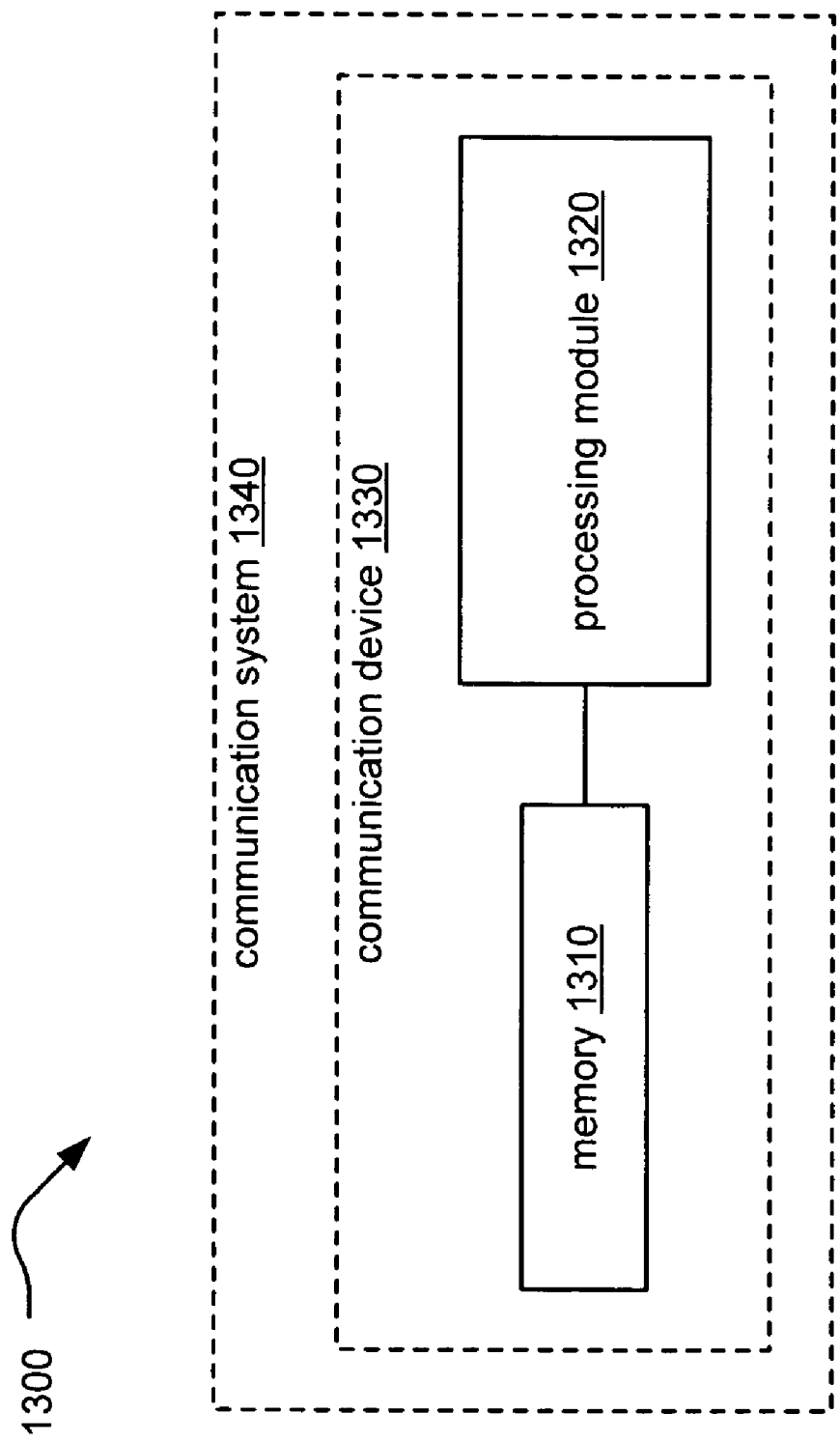
FIG. 13 is a diagram illustrating an embodiment of an apparatus that is operable to represent both a non-parity trellis and a non-parity trellis using minimal hardware

FIG. 13 is a diagram illustrating an embodiment of an apparatus 1300 that is operable to represent both a non-parity trellis and a non-parity trellis using minimal hardware. The apparatus 1300 includes a processing module 1320, and a memory 1310. The memory 1310 is coupled to the processing module, and the memory 1310 is operable to store operational instructions that enable the processing module 1320 to perform a variety of functions. The processing module 1320 (serviced by the memory 1320) can be implemented as an apparatus capable to perform any of the functionality of any of the various modules and/or functional blocks described herein. For example, the processing module 1320 (serviced by the memory 1320) can be implemented as an apparatus capable to represent both the non-parity trellis and the non-parity trellis using a minimal amount of hardware.

The processing module 1320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1300 can be any of a variety of communication devices 1330, or any part or portion of any such communication device 1330. Any such communication device that includes the apparatus 1300 can be implemented within any of a variety of communication systems 1340 as well.

Figure 14:
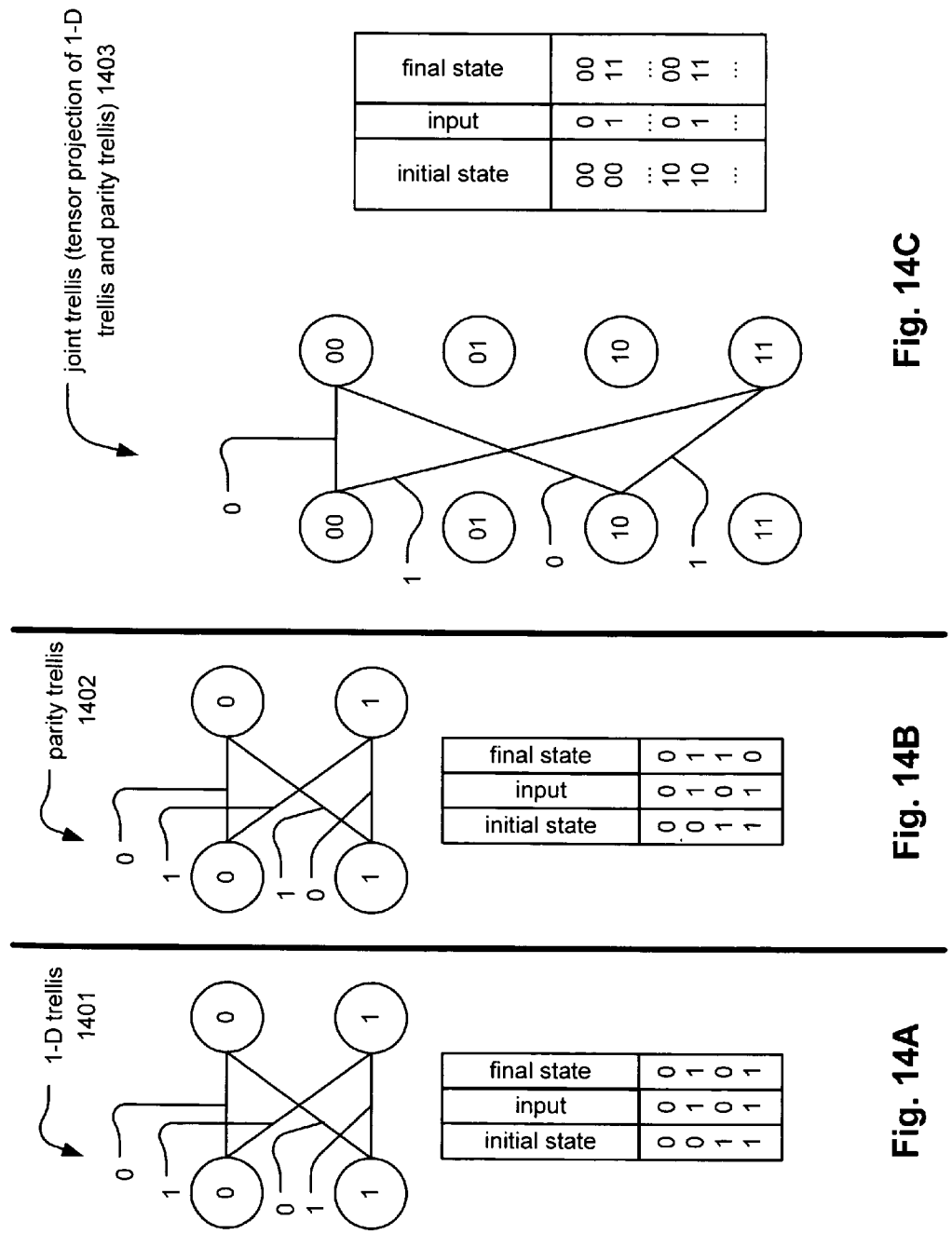
FIG. 14A is a diagram illustrating an embodiment of a one-dimensional (1-D) trellis.
FIG. 14B is a diagram illustrating an embodiment of a parity trellis.
FIG. 14C is a diagram illustrating an embodiment of a joint trellis (shown as being a tensor projection of an ISI trellis and a parity trellis).

FIG. 14A is a diagram illustrating an embodiment of a one-dimensional (1-D) trellis 1401. As shown in the diagram, there are two possible initial states, and two possible final states. The input that is received and the initial state at which the system currently is determines which of the final states the system moves to. For example, when initial state is 0, and when a 0 is received as input, then the final state is also 0. When initial state is 0, and when a 1 is received as input, then the final state is 1. When initial state is 1, and when a 0 is received as input, then the final state is 0. When initial state is 1, and when a 1 is received as input, then the final state is 1.

FIG. 14B is a diagram illustrating an embodiment of a parity trellis 1402. This diagram just happens to be similar to the 1-D trellis of the previous diagram, but generally speaking, a parity trellis need not be similar to a non-parity trellis to which it corresponds (it just happens to be in this case). Generally, the parity trellis will typically be different than the non-parity trellis.

As shown in this diagram, there are also two possible initial states, and two possible final states. Also analogous to the previous diagram, the input that is received and the initial state at which the system currently is determines which of the final states the system moves to. For example, when initial state is 0, and when a 0 is received as input, then the final state is also 0. When initial state is 0, and when a 1 is received as input, then the final state is 1. When initial state is 1, and when a 0 is received as input, then the final state is 1. When initial state is 1, and when a 1 is received as input, then the final state is 0.

FIG. 14C is a diagram illustrating an embodiment of a joint trellis 1403 (shown as being a tensor projection of an ISI trellis and a parity trellis). As with the previous trellises, the input that is received and the initial state at which the system currently is determines which of the final states the system moves to. However, this embodiment includes four initial states and four final states.

It can be seen that the joint trellis 1403 is a tensor projection of the 1-D trellis 1401 and the parity trellis 1402. The joint trellis 1403 is a connected graph and any realization of the tensor product results in a connected graph. Therefore, it is not possible to break the joint trellis 1403 simply into each of the 1-D trellis 1401 and the parity trellis 1402. However, it can be seen that certain of the parallel branches do not require separate branch metric computations; therefore, the branch metrics are the same for certain of the state transitions. This principle is capitalized upon when employing one or more expansion states as described in more detail with respect to other embodiments.

When considering each of the 1-D trellis 1401, the parity trellis 1402, the joint trellis 1403, it can be generalized that when the total number of 1's or 0's (including the input as well as the input state) is an even number, then the parity is 0 (e.g., has an even parity). When the total number of 1's or 0's (including the input as well as the input state) is an odd number, then the parity is 1 (e.g., has an odd parity).

Looking at some of the state transitions in this diagram, when initial state is 00, and when a 0 is received as input, then the final state is also 00. When initial state is 00, and when a 1 is received as input, then the final state is 11. When initial state is 10, and when a 0 is received as input, then the final state is 00. When initial state is 10, and when a 1 is received as input, then the final state is 11.

Figure 15:
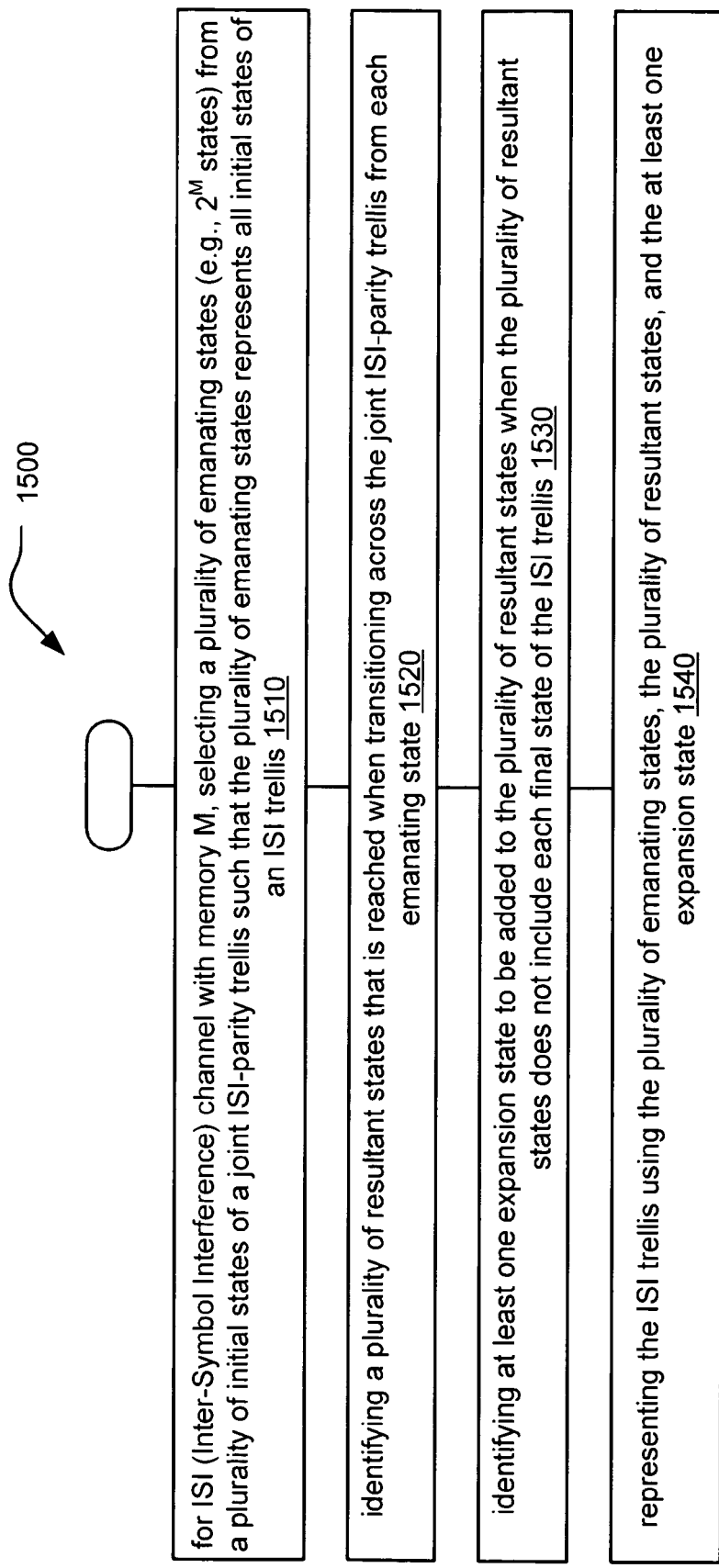
FIG. 15 is a diagram illustrating an embodiment of a method that is operable to represent an ISI trellis (e.g., a non-parity trellis) from a joint ISI-parity trellis.

FIG. 15 is a diagram illustrating an embodiment of a method 1500 that is operable to represent an ISI trellis (e.g., a non-parity trellis) from a joint ISI-parity trellis. Here, and in other portions herein, the term ISI trellis can be employed interchangeably with non-parity trellis for the purposes of the ISI trellis being employing when parity is not considered. Also, a joint trellis is sometimes referred to as a joint ISI-parity trellis.

As shown in a block 1510, the method operates by selecting a plurality of emanating states (e.g., $2^M$ states) from a plurality of initial states of a joint ISI-parity trellis such that the plurality of emanating states represents all initial states of an ISI trellis. The ISI trellis can be viewed as corresponding to an ISI (Inter-Symbol Interference) channel with memory M. It is also noted that the set of emanating states should include all of the states within the ISI trellis.

As shown in a block 1520, the method continues by identifying a plurality of resultant states that is reached when transitioning across the joint ISI-parity trellis from each emanating state. In other words, for each of the emanating states, it is determined to which resultant states the system will move based on the possible inputs the system can receive. The outgoing branches from the emanating states go to the resultant states.

A desirable property of the resultant states is that they have a maximal intersection with the emanating states. This will ideally ensure a hopefully limited number of expansion states that are required to realize fully the ISI trellis from the joint ISI-parity trellis. For example, if the set of the plurality of emanating states is depicted as being E, and the corresponding set of the plurality resultant states (including any expansion states that are required) is depicted as being R(E). In other words, the cardinality, |R(E)ΔE|, should be as small as possible. If the number of states in the union of the emanating states and the resultant states, (R(E)∪E), is more than $2^M$, then this implies that a states expansion has occurred.

As shown in a block 1530, the method continues by identifying at least one expansion state to be added to the plurality of resultant states when the plurality of resultant states does not include each final state of the ISI trellis. It is noted that the ISI trellis is typically smaller in size than the joint trellis, and the total number of final states in the ISI trellis will then typically be a subset of the total number of final states of the joint ISI-parity trellis.

As shown in a block 1540, the method continues by representing the ISI trellis using the plurality of emanating states, the plurality of resultant states, and the at least one expansion state. It is noted that each of the plurality of emanating states, the plurality of resultant states, and the at least one expansion state are selected from the joint ISI-parity trellis. In some instances the path metric and path memory for one or more of the expansion states needs to be associated to one of the other final states of the joint ISI-parity trellis (or one of the other resultant states).

It is noted that the representation of the joint ISI-parity trellis and the ISI trellis (performed using the plurality of emanating states, the plurality of resultant states, and the at least one expansion state) uses less hardware than would be required to represent each of the joint ISI-parity trellis and the ISI trellis straightforwardly (i.e., representing each of them independently in hardware such as in memory).

Figure 16:
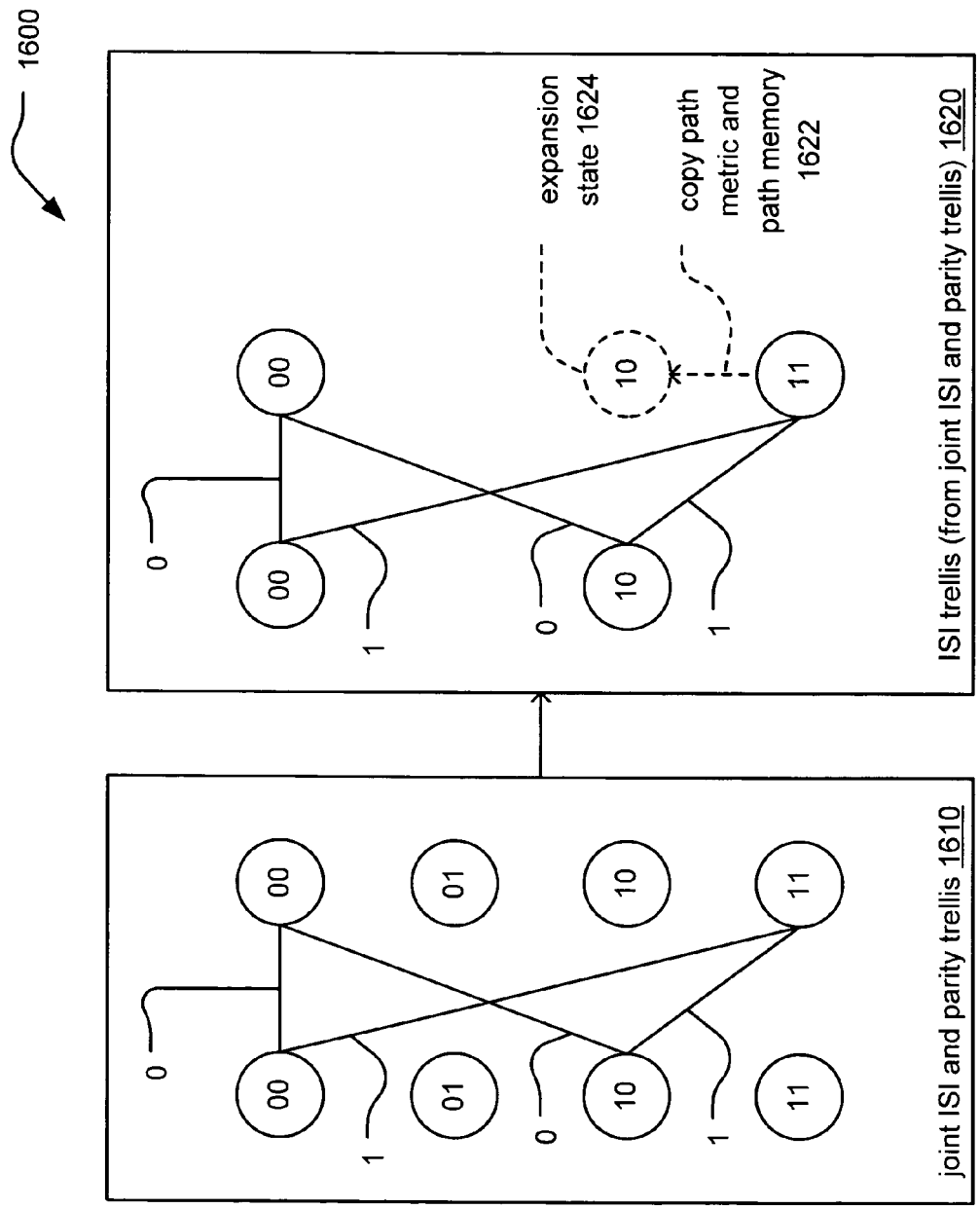
FIG. 16 is a diagram illustrating an embodiment that is operable to represent an ISI trellis (e.g., a non-parity trellis) from a joint ISI-parity trellis.

FIG. 16 is a diagram illustrating an embodiment 1600 that is operable to represent an ISI trellis (e.g., a non-parity trellis) 1620 from a joint ISI-parity trellis 1610. This diagram shows how an ISI trellis 1620 can be generated from a joint ISI-parity trellis 1610 when using only one expansion state "10", shown as reference numeral 1624. It is noted that the path metric and path memory for the expansion state "10" needs to be copied to correspond to the path metric and path memory of the states "11", as shown by the reference numeral 1622.

As can be seen, most of the transitions of the ISI trellis are in fact represented within the joint ISI-parity trellis 1610 according to the branch connectivity therein. Yet, one of the transitions is not directly depicted, so the expansion state "10" 1624 must be included (and the appropriate path metric and path memory copied from the branches that connect to the states "11"), so that all of the states and branch connectivity of the ISI trellis can adequately be represented.

The procedure by which the emanating states, resultant states, and any expansion states may be identified can also be described as follows:

If a first state is included within the emanating state group, say "xyp", then the state which differs from it in the last ISI bit and has the same parity must be included; let such a state be referred to as S. Then xyp and S will map to the same states. If a state xyp is included, then the state which differs in the first ISI bit and parity only is also included as well. This state is included since it represents a different ISI value.

Generally speaking, the aim is to maximize the intersection between the beginning set of states (e.g., emanating states) and the end set of states to which the emanating states transition during a trellis stage transition (e.g., the resultant states).

Figure 19:
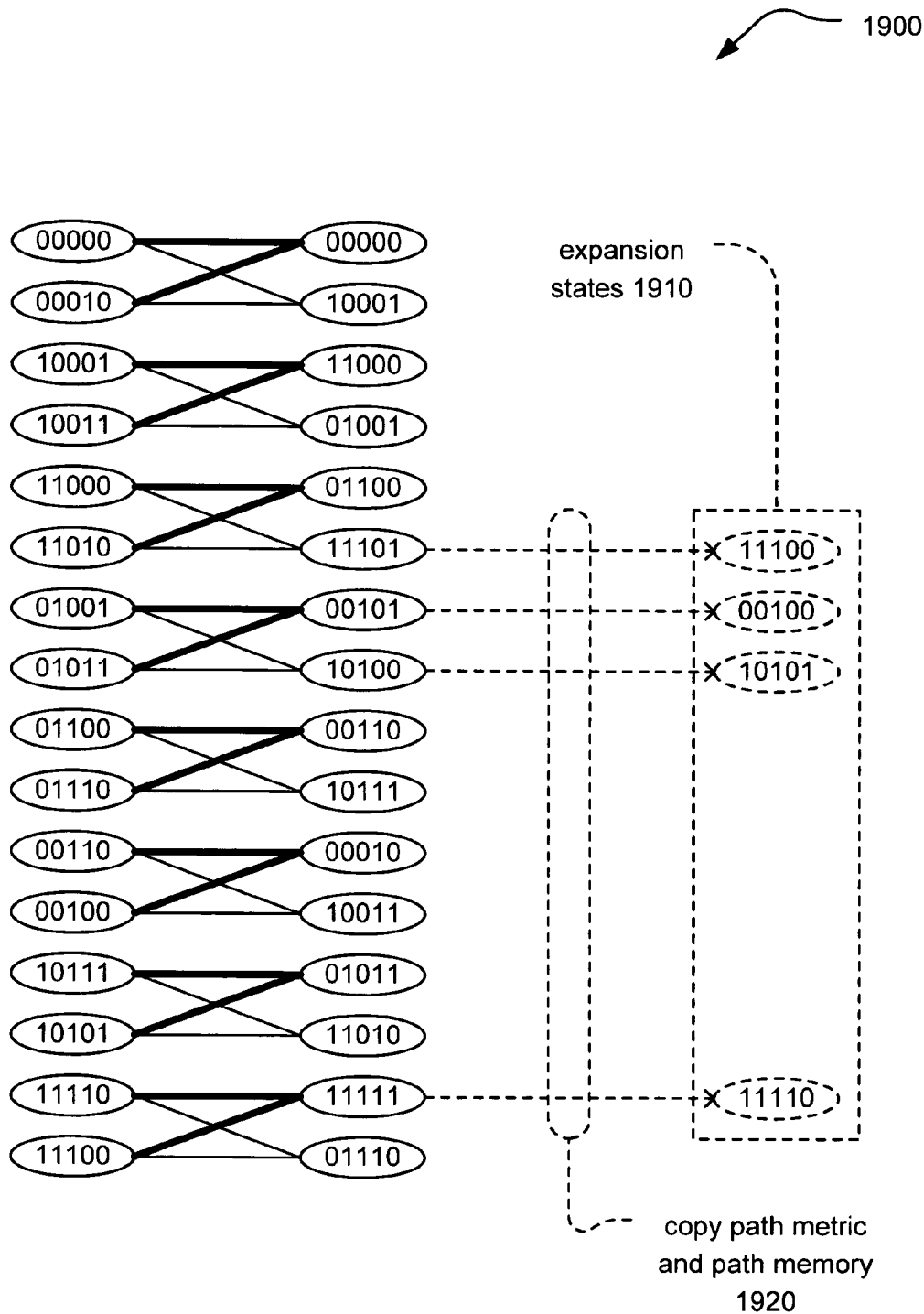
FIG. 19 is a diagram illustrating an embodiment of a 32 state joint trellis.

If E is the set of emanating states, then the resultant states can be depicted by R(E). Again, an aim is to maximize the number of elements in the intersection of E and R(E) and to minimize the cardinality of the set (R(E)ΔE). Certain examples and results are provided below when using these rules. For example, when considering a partial response 4 (PR4) channel, a 6 state ISI trellis is obtained from the 8-state joint ISI-parity trellis. For another example, when considering a 32-state joint ISI-parity trellis, a 20 state ISI trellis is obtained as shown in FIG. 19. A summarization of the construction procedure is presented below.

1. E=Φ, Choose a given state (e.g., the all-zero state and throw it into the set of emanating states, E.
2. Include in E the state which differs in the first ISI bit and the parity bit from the chosen state.
3. Include in E the state which differs in the last ISI bit and has the same parity bit as the chosen state.
4. Now, starting with states in step 2 and step 3, loop back to step 2 and step 3, and populate E.
5. If all the ISI is represented by the chosen states, stop, else throw in another random state with different ISI representation from the chosen states and loop back to step.
6. Compute |R(E)∪E|.

Some additional examples are provided below to show how the various aspects presented herein can be applied and adapted easily to other types and sizes of parity and non-parity (e.g., ISI) trellises.

FIG. 17A is a diagram illustrating an embodiment of a trellis 1701 employed for partial response 4 (PR4). The trellis transitions that correspond to inputs of 0 are in bold face, and the trellis transitions that correspond to inputs of 1 are not.

Looking at some of the state transitions in this diagram, when initial state is 00, and when a 0 is received as input, then the final state is also 00. When initial state is 00, and when a 1 is received as input, then the final state is 10.

When initial state is 10, and when a 0 is received as input, then the final state is 01. When initial state is 10, and when a 1 is received as input, then the final state is 11.

The remaining trellis transitions are depicted in the trellis of the diagram and also in the table included therein.

FIG. 17B is a diagram illustrating an embodiment of a PR4 joint ISI and parity trellis 1702.

Looking at some of the state transitions in this diagram, when initial state is 000, and when a 0 is received as input, then the final state is also 000. When initial state is 000, and when a 1 is received as input, then the final state is 101.

When initial state is 001, and when a 0 is received as input, then the final state is 001. When initial state is 001, and when a 1 is received as input, then the final state is 100.

The remaining trellis transitions are depicted in the trellis of the diagram and also in the table included therein.

Figure 18:
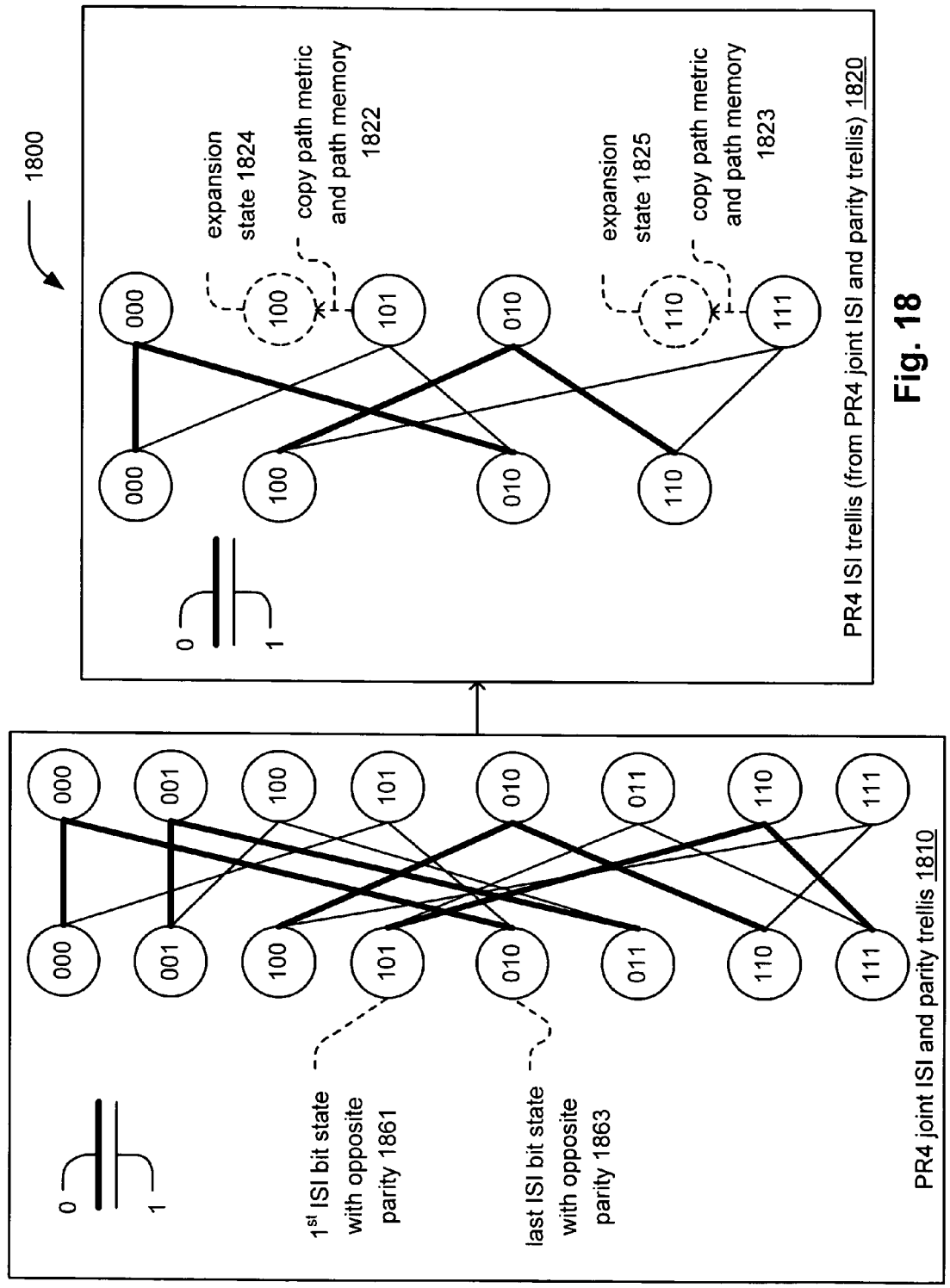
FIG. 18 is a diagram illustrating another embodiment that is operable to represent a PR4 ISI trellis (e.g., a non-parity trellis) from a PR4 joint ISI and parity trellis.

FIG. 18 is a diagram illustrating another embodiment 1800 that is operable to represent a PR4 ISI trellis (e.g., a non-parity trellis) from a PR4 joint ISI and parity trellis. This diagram shows how a PR4 ISI trellis can be generated from the existing initial states, final states, and branch connectivity of a PR4 joint ISI and parity trellis.

Considering the PR4 joint ISI and parity trellis 1810, a first of the emanating states is selected as being the 000 state. Generally speaking, one could start with any of the initial states of the PR4 joint ISI and parity trellis 1810 as being the first emanating states, but the state 000 is selected here for illustrative purposes. Then the two resultant states that are arrived at when transitioning from state 000 across the PR4 joint ISI and parity trellis 1810 are the states 000 (when 0 is input) and 101 (when 1 is input).

Looking at the second of these resultant states (101), it is noted that this is the first emanating state considered that has opposite parity as the first emanating state 000, as shown with respect to reference numeral 1861. The two resultant states that are arrived at when transitioning from state 101 across the PR4 joint ISI and parity trellis 1810 are the states 110 (when 0 is input) and 011 (when 1 is input).

It is noted that the last bit of the state depicts the parity, and the first bit through the second to last bit of the state are the ISI bits (e.g., looking at a 3 bit state value: the first bit of the state is the first ISI bit, and the second/middle bit of the state is the second ISI bit, and the third/last bit of the state is the parity bit). As such, the parity of 000 is 0, and the parity of 101 is 1.

Next, a next emanating state is considered that has the same parity as the second possible emanating state, yet whose first ISI bit differs there from, and also whose resultant states are the same. This state would be 111. The second/middle bit which is the second ISI bit of 111 differs from 101, and the last bit which is the parity bit of 111 is the same as that of 101. The two resultant states that are arrived at when transitioning from state 111 across the PR4 joint ISI and parity trellis 1810 are the states 110 (when 0 is input) and 011 (when 1 is input).

A final possible emanating state is selected as having the same parity as the first emanating state (i.e., same parity as 000) and yet differing with respect to the second/middle bit which is the second ISI bit thereof. This last possible emanating state is therefore 010. Looking at this last possible emanating state (010), it is noted that this state has the same parity as the first emanating state (000 and 010 both have 0 parity) and yet the second/middle bit which is the second ISI bit of 010 differs from 000.

Therefore, it can be seen that the four possible emanating states are 000, 101, 111, and 010. Each of these states is then put into the resultant state group, and the initial states of the PR4 joint ISI and parity trellis 1810 that connect thereto are identified as being 000, 100, 010, and 110. It can be seen that these four states (000, 100, 010, and 110) include two separate states that are not included within the original possible emanating states (000, 101, 111, and 010), and they are the states (100 and 110). Therefore, these states (100 and 110) are selected as being two expansion states, and are added to be included so that the PR4 ISI trellis can adequately be represented using the connectivity of the PR4 joint ISI and parity trellis 1810.

As mentioned above, it is not always possible to decompose a joint ISI-parity trellis directly to represent the ISI (e.g., non-parity) trellis there from. This is the case in this embodiment, and as such, the path metric and path memory for each of these expansion states (100, as depicted using reference numeral 1824, and 110, as depicted using reference numeral 1825) must be copied from the states 101 and 111, respectively, and as shown using reference numerals 1823 and 1822.

Therefore, using the PR4 ISI trellis 1820 can be represented using a plurality of emanating states (000, 100, 010, and 110), a plurality of resultant states (000, 101, 010, and 111), and two expansion states (100 and 110).

FIG. 19 is a diagram illustrating an embodiment of a 32 state joint trellis 1900. A similar procedure can be made as described herein with respect to other embodiments to determine a plurality of emanating states, a plurality of resultant, and a plurality of expansion states 1910, for which the corresponding path metrics and path memories are copied, as shown by reference numeral 1920. By doing this, both a joint ISI-parity trellis and an ISI trellis (i.e., a non-parity trellis) can be represented using less hardware than is required if each of the joint ISI-parity trellis and an ISI trellis (i.e., a non-parity trellis) were represented independently represented.

Some observations are made when considering many of the examples provided above. It is noted that the branch metric and path metric computations for the ISI trellis that is obtained from the joint ISI-parity trellis are increased slightly as a function of the amount of state expansion that needs to be performed.

Fusion of the states with the same ISI corresponds to MUX (multiplex) the path metric and the survivor path memory from the expanded states to the appropriate emanating states. The extra cost is in terms of computation corresponds to the state expansion number and the MUX operation. Looking at one example corresponding to the 32 state trellis described above with respect to the FIG. 19, there are 4 extra states if the joint ISI-parity trellis is employed to obtain the ISI trellis. Still, it is noted that this is less hardware than is required if each of the joint ISI-parity trellis and an ISI trellis (i.e., a non-parity trellis) were represented independently represented.

Figure 20:
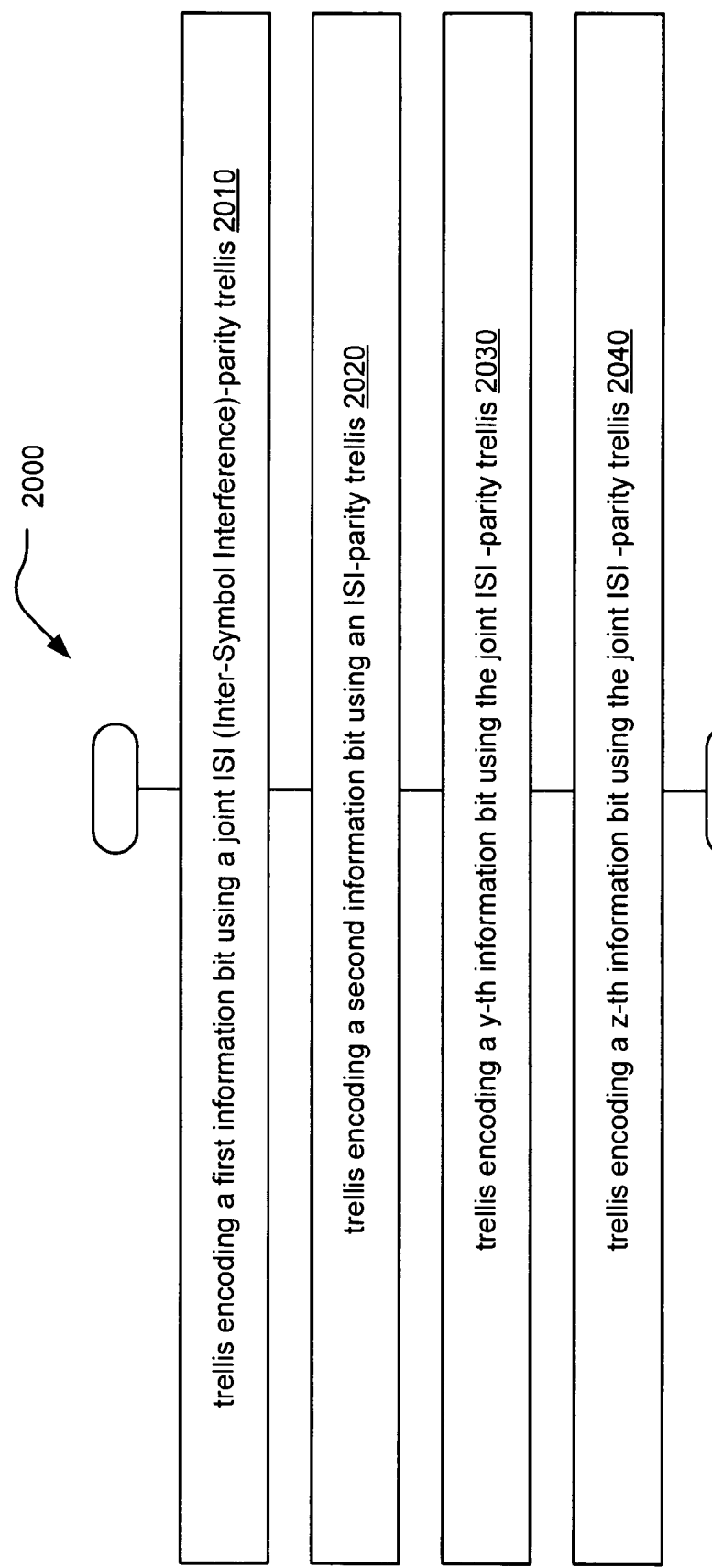
FIG. 20 is a diagram illustrating an embodiment of a method that is operable to perform encoding by using at least two trellises.

FIG. 20 is a diagram illustrating an embodiment of a method 2000 that is operable to perform encoding by using at least two trellises. This embodiment can be viewed as being capable to perform trellis encoding according to a first trellis at a first time, and then being capable to perform trellis encoding according to a second trellis at a second time. This switching back and forth between the first trellis and the second trellis can be performed any number of ways as desired in various embodiments including on a per packet basis, on a per symbol basis, and/or other basis.

As shown in a block 2010, the method 2000 begins by trellis encoding a first information bit using a joint ISI (Inter-Symbol Interference)-parity trellis. As shown in a block 2020, the method 2000 continues by trellis encoding a second information bit using an ISI-parity trellis. As shown in a block 2030, the method 2000 continues by trellis encoding a y-th information bit using the joint ISI-parity trellis. This y-th information bit may be a 2nd information bit, or it may be an information bit much further along in a sequence of information bits (e.g., it may be in the same packet, or in a subsequent packet). As shown in a block 2040, the method 2000 continues by trellis encoding a z-th information bit using the joint ISI-parity trellis. This z-th information bit may be a 3rd information bit, or it may be an information bit much further along in a sequence of information bits after the y-th information bit (e.g., it may be in the same packet, or in a subsequent packet). As can be seen, the method 2000 is operable to perform trellis encoding of different information bits using different trellises.

Figure 21:
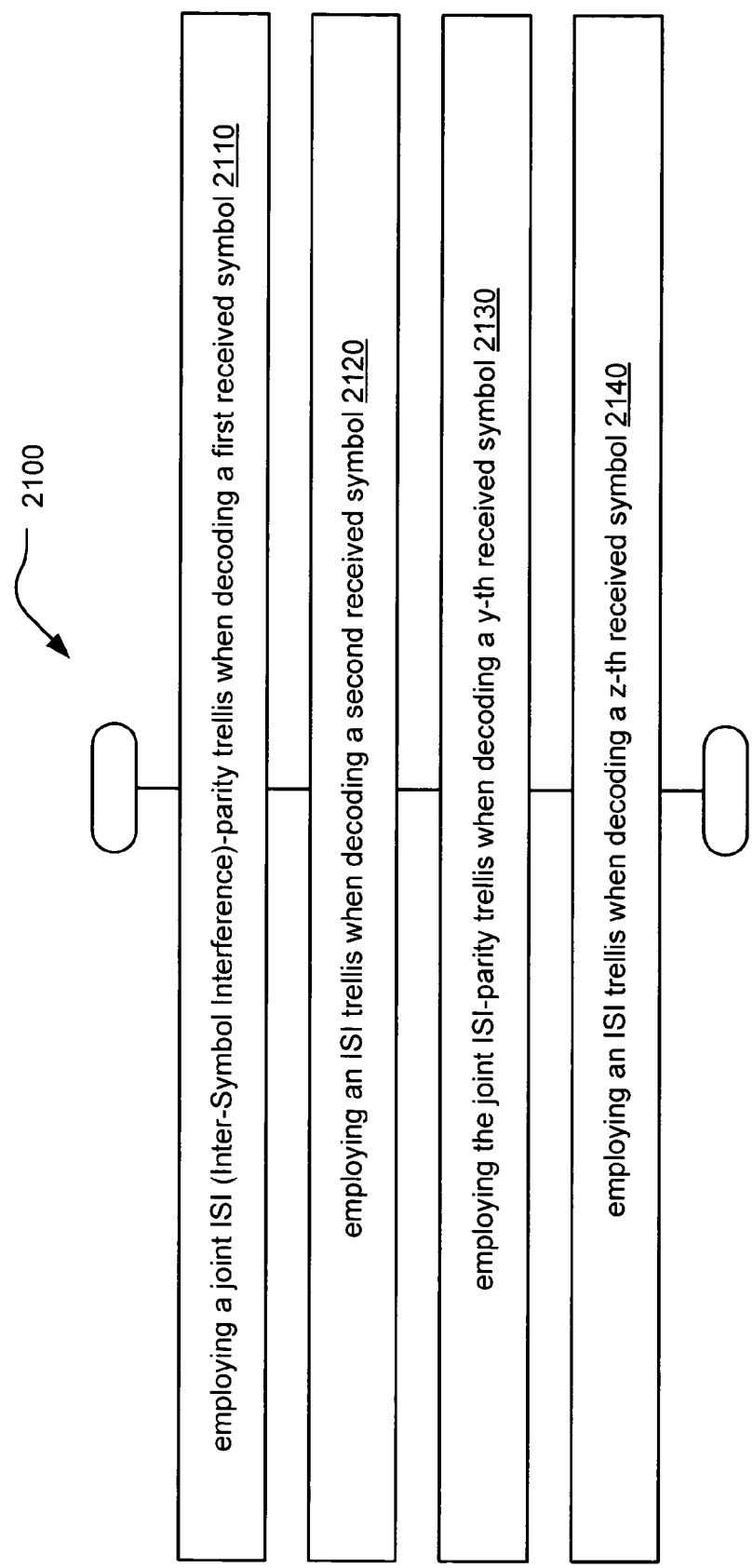
FIG. 21 is a diagram illustrating an embodiment of a method that is operable to perform decoding by using at least two trellises.

FIG. 21 is a diagram illustrating an embodiment of a method 2100 that is operable to perform decoding by using at least two trellises. This embodiment can be viewed as being capable to perform decoding according to a first trellis at a first time, and then being capable to perform decoding according to a second trellis at a second time. This switching back and forth between the first trellis and the second trellis can be performed any number of ways as desired in various embodiments including on a per packet basis, on a per symbol basis, and/or other basis.

As shown in a block 2110, the method 2100 begins by employing a joint ISI (Inter-Symbol Interference)-parity trellis when decoding a first received symbol. As shown in a block 2120, the method 2100 continues by employing an ISI trellis when decoding a second received symbol. As shown in a block 2130, the method 2100 continues by employing the joint ISI-parity trellis when decoding a y-th received symbol. This y-th received symbol may be a 2nd symbol, or it may be a symbol much further along in a sequence of symbols. As shown in a block 2140, the method 2100 continues by employing an ISI trellis when decoding a z-th received symbol. This z-th received symbol may be a 3rd symbol, or it may be a symbol much further along in a sequence of symbols after the y-th symbol. As can be seen, the method 2100 is operable to perform decoding of different symbols using different trellises.

Figure 22:
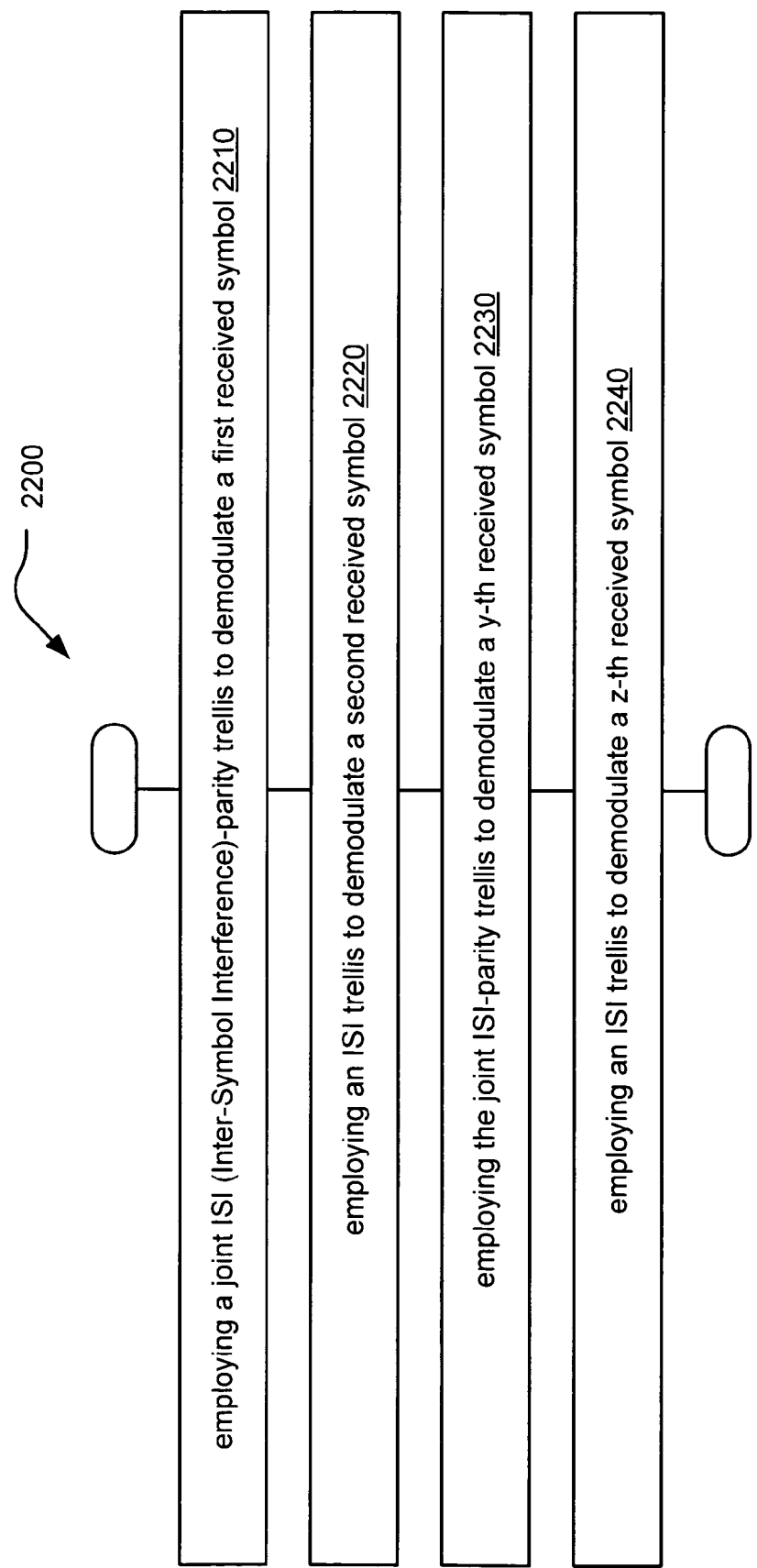
FIG. 22 is a diagram illustrating an embodiment of a method that is operable to perform demodulation by using at least two trellises.

FIG. 22 is a diagram illustrating an embodiment of a method 2200 that is operable to perform demodulation by using at least two trellises. This embodiment is somewhat analogous to that of FIG. 21 that performs decoding of different symbols using different trellises. However, this embodiment focuses particularly on performing demodulation of different symbols using different trellises. In some embodiments, the demodulation processing when employing a trellis is described as performing detection.

As shown in a block 2210, the method 2200 begins by employing a joint ISI (Inter-Symbol Interference)-parity trellis to demodulate a first received symbol. As shown in a block 2220, the method 2200 continues by employing an ISI trellis to demodulate a second received symbol. As shown in a block 2230, the method 2200 continues by employing the joint ISI-parity trellis to demodulate a y-th received symbol. This y-th received symbol may be a 2nd symbol, or it may be a symbol much further along in a sequence of symbols. As shown in a block 2240, the method 2200 continues by employing an ISI trellis to demodulate a z-th received symbol. This z-th received symbol may be a 3rd symbol, or it may be a symbol much further along in a sequence of symbols after the y-th symbol. As can be seen, the method 2200 is operable to perform demodulation of different symbols using different trellises.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
   a processing module; and
   a memory, coupled to the processing module, that is operable to store operational instructions that enable the processing module to perform at least one of:
   employ either a joint ISI (Inter-Symbol Interference)-parity trellis or an ISI trellis to perform trellis encoding of a first information bit; and
   employ either the joint ISI-parity trellis or the ISI trellis when decoding a received symbol thereby making a best estimate of a second information bit encoded within the received symbol; and wherein:
   the memory is operable to represent the joint ISI-parity trellis by storing information corresponding to:
   a plurality of initial states of the joint ISI-parity trellis;
   a plurality of final states of the joint ISI-parity trellis; and
   corresponding branch connectivity between the plurality of initial states and the plurality of final states within the joint ISI-parity trellis;
   the memory is operable to represent the ISI trellis by storing information corresponding to:
   a plurality of emanating states selected from the plurality of initial states of the joint ISI-parity trellis such that the plurality of emanating states includes each possible initial state of a plurality of initial states of the ISI trellis;
   a plurality of resultant states that is reached when transitioning across the joint ISI-parity trellis from each emanating state of the plurality of emanating states;
   at least one expansion state, that is selected from the plurality of final states of the joint ISI-parity trellis and that is added to the plurality of resultant states to generate an expanded plurality of resultant states such that the expanded plurality of resultant states includes each possible final state of a plurality of final states of the ISI trellis; and a first sum of the plurality of initial states of the joint ISI-parity trellis, the plurality of final states of the joint ISI-parity trellis, and the at least one expansion state of the ISI trellis includes fewer states than a second sum of the plurality of initial states of the joint ISI-parity trellis, the plurality of final states of the joint ISI-parity trellis; the plurality of initial states of the ISI trellis, and the plurality of final states of the ISI trellis.

2. The apparatus of claim 1, wherein:
the memory is operable store information to associate a path metric that corresponds to one resultant state of the plurality of resultant states with the at least one expansion state.

3. The apparatus of claim 1, wherein:
the memory is operable store information to associate a path memory that corresponds to one resultant state of the plurality of resultant states with the at least one expansion state.

4. The apparatus of claim 1, wherein the memory, coupled to the processing module, is operable to store operational instructions that enable the processing module to:
employ the joint ISI-parity trellis to perform trellis encoding of the first information bit; and
employ the ISI trellis to perform trellis encoding of a third information bit.

5. The apparatus of claim 1, wherein the memory, coupled to the processing module, is operable to store operational instructions that enable the processing module to:
employ the joint ISI-parity trellis when decoding the received symbol thereby making the best estimate of the second information bit encoded within the received symbol; and
employ the ISI trellis when decoding at least one additional received symbol thereby making a best estimate of a fourth information bit encoded within the at least one additional received symbol.

6. The apparatus of claim 1, wherein the memory, coupled to the processing module, is operable to store operational instructions that enable the processing module to:
employ either the ISI stage or the joint ISI-parity trellis when demodulating the received symbol thereby generating a LLR (log likelihood ratio); and
perform iterative decoding processing, using the LLR, thereby making the best estimate of the second information bit encoded within the received symbol.

7. The apparatus of claim 6, wherein:
the received symbol is generated from either a turbo coded signal or an LDPC (Low Density Parity Check) coded signal that is received from a communication channel; and
the iterative decoding processing includes either turbo decoding processing or LDPC decoding processing depending on whether the received signal is the turbo coded signal or the LDPC (Low Density Parity Check) coded signal.

8. An apparatus, comprising:
a processing module; and
a memory, coupled to the processing module, that is operable to store operational instructions that enable the processing module to:
employ a joint ISI (Inter-Symbol Interference)-parity trellis when demodulating a first received symbol thereby generating a first LLR (log likelihood ratio);

employ an ISI trellis non-parity trellis when demodulating a second received symbol thereby generating a second LLR; and perform iterative decoding processing, using the first LLR, thereby making a first best estimate of a first information bit encoded within the first received symbol;

perform iterative decoding processing, using the second LLR, thereby making a second best estimate of a second information bit encoded within the second received symbol; and wherein:

the memory is operable to represent the joint ISI-parity trellis by storing information corresponding to:
a plurality of initial states of the joint ISI-parity trellis;
a plurality of final states of the joint ISI-parity trellis; and
corresponding branch connectivity between the plurality of initial states and the plurality of final states within the joint ISI-parity trellis;

the memory is operable to represent the ISI trellis by storing information corresponding to:
a plurality of emanating states selected from the plurality of initial states of the joint ISI-parity trellis such that the plurality of emanating states includes each possible initial state of a plurality of initial states of the ISI trellis;
a plurality of resultant states that is reached when transitioning across the joint ISI-parity trellis from each emanating state of the plurality of emanating states;
at least one expansion state, that is selected from the plurality of final states of the joint ISI-parity trellis and that is added to the plurality of resultant states to generate an expanded plurality of resultant states such that the expanded plurality of resultant states includes each possible final state of a plurality of final states of the ISI trellis; and a first sum of the plurality of initial states of the joint ISI-parity trellis, the plurality of final states of the joint ISI-parity trellis, and the at least one expansion state of the ISI trellis includes fewer states than a second sum of the plurality of initial states of the joint ISI-parity trellis, the plurality of final states of the joint ISI-parity trellis; the plurality of initial states of the ISI trellis, and the plurality of final states of the ISI trellis.

9. The apparatus of claim 8, wherein:
at least one of the first received symbol and the second received symbol is generated from either a turbo coded signal or an LDPC (Low Density Parity Check) coded signal that is received from a communication channel; and
the iterative decoding processing includes either turbo decoding processing or LDPC decoding processing depending on whether the received signal is the turbo coded signal or the LDPC (Low Density Parity Check) coded signal.

10. The apparatus of claim 8, wherein:
the memory is operable store information to associate a path metric and a path memory that each correspond to one resultant state of the plurality of resultant states with the at least one expansion state.

11. A method, comprising:
selecting a plurality of emanating states from a plurality of initial states of a joint ISI (Inter-Symbol Interference)-parity trellis, the plurality of emanating states including each initial state of a plurality of initial states of an ISI trellis;

identifying a plurality of resultant states that is reached when transitioning across the joint ISI-parity trellis from each emanating state of the plurality of emanating states;

identifying at least one expansion state to be added to the plurality of resultant states when the plurality of resultant states does not include each final state of a plurality of final states of an ISI trellis;

representing the ISI trellis using the plurality of emanating states, the plurality of resultant states, and the at least one expansion state; and performing at least one of:

employing either the joint ISI-parity trellis or the ISI trellis to perform trellis encoding of a first information bit; and employing either the joint ISI-parity trellis or the ISI trellis when decoding a received symbol thereby making a best estimate of a second information bit encoded within the received symbol.

12. The method of claim 11, further comprising:

associating a path metric that corresponds to one resultant state of the plurality of resultant states with the at least one expansion state.

13. The method of claim 11, further comprising:

associating a path memory that corresponds to one resultant state of the plurality of resultant states with the at least one expansion state.

14. The method of claim 11, further comprising:

employing the joint ISI-parity trellis to perform trellis encoding of the first information bit; and employing the ISI trellis to perform trellis encoding of a third information bit.

15. The method of claim 11, further comprising:

employing the joint ISI-parity trellis when decoding the received symbol thereby making the best estimate of the second information bit encoded within the received symbol; and employing the ISI trellis when decoding at least one additional received symbol thereby making a best estimate of a fourth information bit encoded within the at least one additional received symbol.

16. The method of claim 11, further comprising:

processing a signal that is received from a communication channel thereby generating the received symbol.

17. The method of claim 11, further comprising:

processing a signal that is received from either with a wired or wireless communication channel thereby generating the received symbol.

18. The method of claim 11, wherein:

the received symbol is generated from a signal that is received from a communication channel; and the communication channel is a read channel that is coupled to a storage media of a hard disk drive (HDD).

19. The method of claim 11, further comprising:

employing either the joint ISI-parity trellis or the ISI trellis when demodulating the received symbol thereby generating a LLR (log likelihood ratio); and performing iterative decoding processing, using the LLR, thereby making the best estimate of the second information bit encoded within the received symbol.

20. The method of claim 19, wherein:

the received symbol is generated from either a turbo coded signal or an LDPC (Low Density Parity Check) coded signal that is received from a communication channel; and the iterative decoding processing includes either turbo decoding processing or LDPC decoding processing depending on whether the received signal is the turbo coded signal or the LDPC (Low Density Parity Check) coded signal.

* * * * *